(12) United States Patent
Ha et al.

(10) Patent No.: US 9,214,593 B2
(45) Date of Patent: Dec. 15, 2015

(54) SOLAR CELL AND METHOD FOR MANUFACTURING THE SAME

(71) Applicant: LG ELECTRONICS INC., Seoul (KR)

(72) Inventors: Jungmin Ha, Seoul (KR); Junyong Ahn, Seoul (KR); Jinho Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/691,396

(22) Filed: Apr. 20, 2015

(65) Prior Publication Data

US 2015/0228843 A1    Aug. 13, 2015

Related U.S. Application Data

(60) Continuation of application No. 14/286,806, filed on May 23, 2014, now Pat. No. 9,029,188, which is a division of application No. 13/331,787, filed on Dec. 20, 2011, now abandoned.

(30) Foreign Application Priority Data

Dec. 21, 2010   (KR) .................. 10-2010-0131823

(51) Int. Cl.
    *H01L 31/18*      (2006.01)
    *H01L 31/0216*    (2014.01)
    *H01L 31/0352*    (2006.01)
    (Continued)

(52) U.S. Cl.
    CPC ........ *H01L 31/186* (2013.01); *H01L 31/02168* (2013.01); *H01L 31/022425* (2013.01); *H01L 31/03529* (2013.01); *H01L 31/068* (2013.01); *H01L 31/18* (2013.01); *H01L 31/1864* (2013.01); *Y02E 10/52* (2013.01); *Y02E 10/547* (2013.01)

(58) Field of Classification Search
    CPC ................. H01L 31/022425; H01L 31/02168; H01L 31/03529; H01L 31/068; H01L 31/18
    USPC ......................................... 438/98
    See application file for complete search history.

(56) References Cited

U.S. PATENT DOCUMENTS 7,611,977 B2  11/2009  Zhang et al.
8,071,418 B2  12/2011  Rohatgi et al.
(Continued)

FOREIGN PATENT DOCUMENTS

KR  10-2009-0089526 A1  8/2009
KR  10-2010-0029063 A    3/2010
KR  10-2011-0040141 A1  4/2011

*Primary Examiner* — Earl Taylor
(74) *Attorney, Agent, or Firm* — Birch, Stewart, Kolasch & Birch, LLP

(57) ABSTRACT

A method for manufacturing a solar cell is discussed. The method may include injecting first impurity ions at a first surface of a substrate by using a first ion implantation method to form a first impurity region, the substrate having a first conductivity type and the first impurity ions having a second conductivity type, and the first impurity region having the second conductivity type; heating the substrate with the first impurity region to activate the first impurity region to form an emitter region from the first impurity region; etching the emitter region from a surface of the emitter region to a predetermined depth to form an emitter part from the emitter region; and forming a first electrode on the emitter part to connect to the emitter part and a second electrode on a second surface of the substrate to connect to the second surface of the substrate.

20 Claims, 13 Drawing Sheets

(51) Int. Cl.
   *H01L 31/068* (2012.01)
   *H01L 31/0224* (2006.01)

(56) References Cited

U.S. PATENT DOCUMENTS

| | | |
|---|---|---|
| 8,110,431 B2 | 2/2012 | Rohatgi et al. |
| 2002/0153039 A1 | 10/2002 | Moon et al. |
| 2004/0112426 A1 | 6/2004 | Hagino |
| 2009/0056807 A1 | 3/2009 | Chen et al. |
| 2010/0167461 A1 | 7/2010 | Rana et al. |
| 2010/0218826 A1 | 9/2010 | Hahn et al. |
| 2010/0326504 A1 | 12/2010 | Park et al. |
| 2011/0139229 A1 | 6/2011 | Rohatgi et al. |
| 2011/0139230 A1 | 6/2011 | Rohatgi et al. |
| 2011/0159633 A1 | 6/2011 | Kim |
| 2012/0152338 A1 | 6/2012 | Ha et al. |
| 2012/0199202 A1 | 8/2012 | Prajapati |
| 2013/0034928 A1 | 2/2013 | Kim |

SOLAR CELL AND METHOD FOR MANUFACTURING THE SAME

CROSS-REFERENCE TO RELATED APPLICATIONS

This application is a Continuation of co-pending U.S. application Ser. No. 14/286,806, filed on May 23, 2014, which is a Divisional of U.S. application Ser. No. 13/331,787 filed Dec. 20, 2011, which claims priority under 35 U.S.C. §119(a) to Korean Patent Application No. 10-2010-0131823, filed in the Korean Intellectual Property Office on Dec. 21, 2010, all of which are hereby expressly incorporated by reference into the present application.

BACKGROUND OF THE INVENTION

1. Field of the Invention

Embodiments of the invention relate to a solar cell and a method for manufacturing the same.

2. Discussion of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductivity types, such as a p-type and an n-type, and form a p-n junction, and electrodes respectively connected to the semiconductor parts of the different conductivity types.

When light is incident on the solar cell, electron-hole pairs are generated in the semiconductor parts. The electrons move to the n-type semiconductor part and the holes move to the p-type semiconductor part, and then the electrons and holes are collected by the electrodes connected to the n-type semiconductor part and the p-type semiconductor part, respectively. The electrodes are connected to each other using electric wires to thereby obtain electric power.

SUMMARY OF THE INVENTION

According to an aspect of the invention, a method for manufacturing a solar cell includes injecting first impurity ions at a first surface of a substrate by using a first ion implantation method to form a first impurity region, the substrate having a first conductivity type and the first impurity ions having a second conductivity type opposite the first conductivity type, and the first impurity region having the second conductivity type, heating the substrate with the first impurity region to activate the first impurity region to form an emitter region from the first impurity region, etching the emitter region from a surface of the emitter region to a predetermined depth to form an emitter part from the emitter region, and forming a first electrode on the emitter part to connect to the emitter part and a second electrode on a second surface of the substrate, which is opposite the first surface of the substrate to connect to the second surface of the substrate.

The heating of the substrate may heat the first impurity portion at 800° C. to 1100° C. in a nitrogen atmosphere.

The etching of the emitter region may remove a portion of the emitter region from the surface of the emitter region to a depth of 5 nm to 20 nm.

The emitter region may be etched by an etchant composed of nitric acid $HNO_3$, hydrofluoric acid HF and pure wafer.

The heating of the substrate may heat the first impurity portion at 800° C. to 1100° C. in an oxygen atmosphere.

The etching of the emitter region may remove a portion of the emitter region from the surface of the emitter region to a depth of 20 nm to 35 nm.

The emitter region may be etched by an etchant composed of hydrofluoric acid HF and pure wafer.

The emitter part may include a first emitter portion having a first impurity doped thickness and a second emitter portion having a second impurity doped thickness greater than the first impurity doped thickness, wherein the etching of the emitter region includes: selectively forming an etch prevention layer on the emitter region to expose a portion of the emitter region and to cover a remaining portion of the emitter region, and etching the exposed portion of the emitter region from the surface of the emitter region to the predetermined depth using the etch prevention layer as a mask, and removing the etch prevention layer, wherein the etched exposed portion of the emitter region is formed as the first emitter portion and the remaining portion of the emitter region is formed as the second emitter portion.

The first impurity region may include a first impurity portion having a first impurity doped thickness and a second impurity portion having a second impurity doped thickness greater than the first impurity doped thickness, and wherein the injecting of the first impurity ions forms the first and second impurity portions by use of a mask positioned at the first surface of the substrate and use of the first ion implantation method.

The mask may include a first portion having a first exposing area for forming the first impurity portion and a second portion having a second exposing area for forming the second impurity portion, the first and second exposing areas being areas exposing the substrate in a unit area thereof.

The method may further include forming the first impurity region not having the first and second impurity portions at an entire first surface of the substrate by injecting the first impurity ions of the second conductivity type at the entire first surface of the substrate without a mask, before forming the first and second impurity portions of the first impurity region, wherein the forming of the first and second impurity portions of the first impurity region forms the first and second impurity portions by use of the mask positioned at the first impurity region not having the first and second impurity portions and use of the first ion implantation method.

The method may further include injecting second impurity ions at a second surface of the substrate by using an ion implantation method to form a second impurity region of the first conductivity type, the second surface being opposite the first surface of the substrate, heating the substrate with the second impurity region to activate the second impurity region to form an surface field region from the second impurity region, and etching the surface field region from a surface of the surface field region to a predetermined depth to form a surface field part from the surface field region, wherein the second electrode is connected to the second surface of the substrate through the surface field part.

The surface field part may include a first surface field portion having a first impurity doped thickness and a second surface field portion having a second impurity doped thickness greater than the first impurity doped thickness, wherein the etching of the surface field region includes: selectively forming an etch prevention layer on the surface field region to expose a portion of the surface field region and to cover a remaining portion of the surface field region, etching the exposed portion of the surface field region from the surface of the surface field region to the predetermined depth using the etch prevention layer as a mask, and removing the etch prevention layer, wherein the etched exposed portion of the surface field region is formed as the first surface field portion and the remaining portion is formed is formed as the second surface field portion.

The second electrode may be in contact with the second surface field portion and is connected to the second surface of the substrate through the second surface field portion.

The first and second surfaces of the substrate may be light incident surfaces on which light is incident.

The second impurity region may include a first impurity portion having a first impurity doped thickness and a second impurity portion having a second impurity doped thickness greater than the first impurity doped thickness, wherein the injecting of the second impurity ions forms the first and second impurity portions by use of a mask positioned at first surface of the substrate and use of the second ion implantation method.

The mask may include a first portion having a first exposing area for forming the first impurity portion and a second portion having a second exposing area for forming the second impurity portion, the first and second exposing areas being areas exposing the substrate in a unit area thereof.

The method may further include forming the second impurity region not having the first and second impurity portions at an entire second surface of the substrate by injecting the second impurity ions of the first conductivity type at the entire second surface of the substrate without a mask, before forming the first and second impurity portions of the second impurity region, wherein the forming of the first and second impurity portions of the second impurity region forms the first and second impurity portions by use of the mask positioned at the second impurity part not having the first and second impurity portions and use of the second ion implantation method.

The second electrode may be in contact with the second surface field portion and is connected to the second surface of the substrate through the second surface field portion.

The first and second surfaces of the substrate may be light incident surfaces on which light is incident.

According to another aspect of the invention, a solar cell may include a substrate into which an impurity of a first conductivity type is doped, an emitter part positioned at a first surface of the substrate, into which an impurity of a second conductivity type opposite the first conductivity type is doped, and comprising a first emitter portion having a first impurity doped thickness and a second emitter portion having a second impurity doped thickness greater than the first impurity doped thickness, a first electrode positioned at the second emitter portion and connected to the second emitter portion, and a second electrode positioned at a second surface of the substrate and connected to the substrate, the second surface being opposite the first surface of the substrate, wherein a junction surface between the first emitter portion and the substrate is positioned at a same height as a junction surface between the second emitter portion and the substrate, and a damage amount existing at the second emitter portion is more than a damage amount existing at the first emitter portion.

The solar cell may further include an anti-reflection layer positioned on the first emitter portion of the emitter part.

The solar cell may further include a surface field part positioned between the second surface of the substrate and the second electrode and doped with an impurity of the first conductivity type.

The surface field part may include a first surface field portion having a third impurity doped thickness and a second surface field portion having a fourth impurity doped thickness greater than the third impurity doped thickness, a first electrode positioned at the second emitter portion and connected to the second emitter portion, and a damage amount existing at the second surface field portion is more than a damage amount existing at the first surface field portion.

The second electrode may be positioned on the second surface field portion and connected to the second surface field portion.

The first and second surfaces of the substrate may be light incident surfaces on which light is incident.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings.

DETAILED DESCRIPTION OF THE INVENTION

Figure 1:
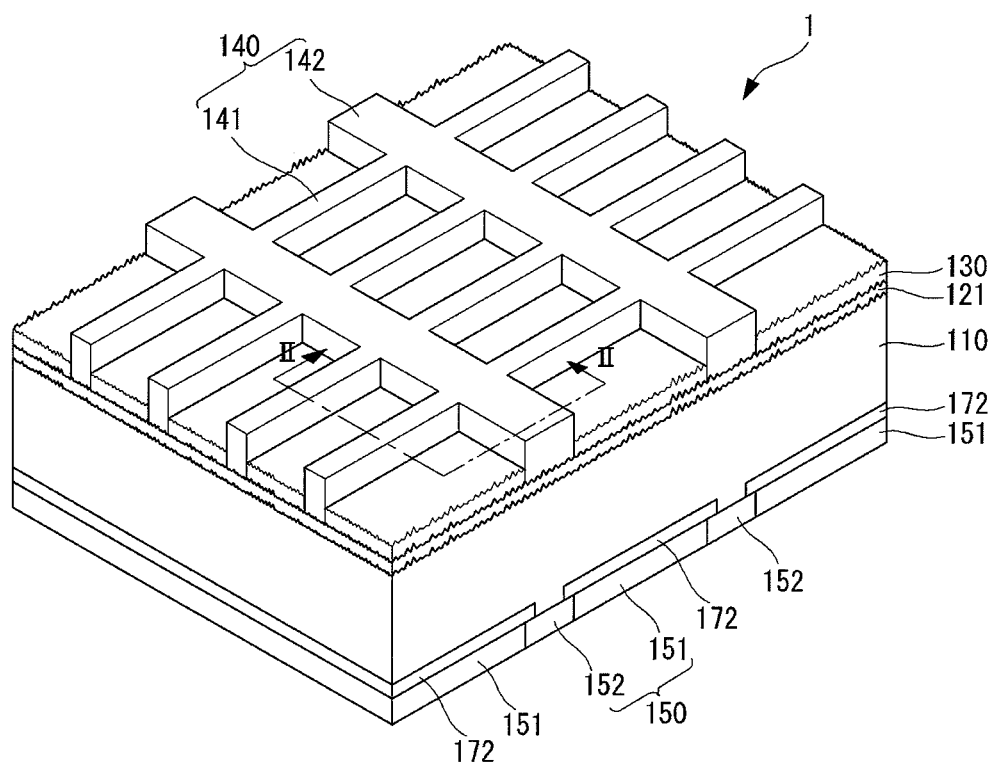
FIG. 1 is a partial perspective view of a solar cell according to an example embodiment of the invention.

The invention will be described more fully hereinafter with reference to the accompanying drawings, in which example embodiments of the inventions are shown. This invention may, however, be embodied in many different forms and should not be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to example embodiments of the invention, examples of which are illustrated in the accompanying drawings.

An example of a solar cell according to an example embodiment of the invention is described in detail with reference to FIGS. 1 and 2.

Figure 2:
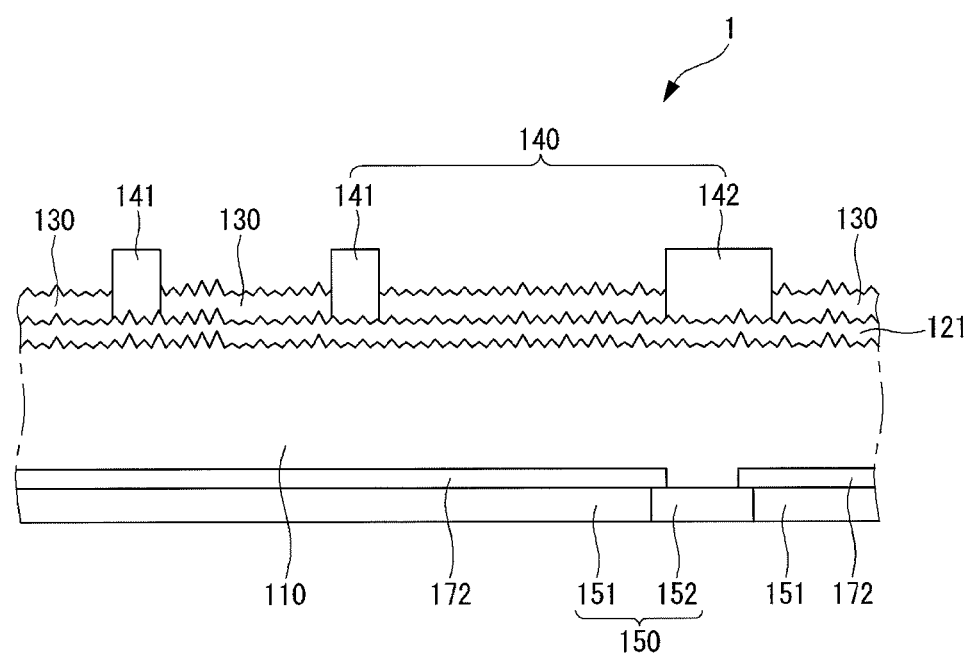
FIG. 2 is a cross-sectional view taken along line II-II of FIG. 1.

As shown in FIGS. 1 and 2, a solar cell 1 according to an example embodiment of the invention includes a substrate 110, an emitter part 121 positioned at an incident surface (hereinafter, referred to as "a front surface" or "a first surface") of the substrate 110 on which light is incident, an anti-reflection layer 130 positioned on the emitter part 121, a front electrode part 140 positioned on the emitter part 121, a back surface field part 172 positioned at a surface (hereinafter, referred to as "a back surface" or "a second surface") opposite the front surface of the substrate 110, and a back electrode part 150 positioned on the back surface of the substrate 110 and the back surface field part 172.

The substrate 110 is a semiconductor substrate such as silicon of a first conductivity type, for example, an n-type, though not required. The semiconductor is a crystalline semiconductor of single crystalline silicon or poly crystal silicon.

When the substrate 110 is of an n-type, the substrate 110 may be doped with impurities of a group V element such as phosphorus (P), arsenic (As), and antimony (Sb). Alternatively, the substrate 110 may be of a p-type. When the substrate 110 is of the p-type, the substrate 110 may be doped with impurities of a group III element such as boron (B), gallium (Ga), and indium (In).

The front surface of the substrate 110 is textured to form a textured surface corresponding to an uneven surface or having uneven characteristics and including a plurality of projections and a plurality of depressions. FIG. 1 shows that only an edge of the substrate 110 and only an edge of the anti-reflection layer 130 on the substrate 110 have a plurality of uneven portions for the sake of brevity. However, the entire front surface of the substrate 110 is the textured surface having the plurality of uneven portions, and thus the anti-reflection layer 130 on the front surface of the substrate 110 has a textured surface having a plurality of uneven portions. In an alternative example, the back surface as well as the front surface of the substrate 110 may have a textured surface.

By the textured surface of the substrate 110 having the plurality of projections, the surface area of the substrate 110 and the surface area of the anti-reflection layer 130 increase and an amount of light reflected by the substrate 110 decreases and thereby, an amount of light incident on the substrate 110 increases.

The emitter part 121 is an impurity region obtained by doping the substrate 110 with impurities of a second conductivity type (for example, a p-type) opposite the first conductivity type of the substrate 110. Thus, the emitter part 121 forms a p-n junction with the substrate 110 (that is, the first conductivity type portion of the substrate 110).

In this example, the emitter part 121 is formed by an ion implantation method. Thereby, when compared with an emitter part formed by a thermal diffusion method, the maximum impurity doped concentration (that is, the maximum surface impurity doped concentration) of a surface (that is, the front surface, electrode part 140 is positioned thereat and a surface opposite a p-n junction surface between the first conductivity portion of the substrate 110 and the emitter part 121) of the emitter part 121 increases and an impurity doped thickness of the emitter part 121 decreases.

In the thermal diffusion method, for increasing an impurity doped concentration of a surface of the emitter part, it is required to increase a process time, but since the impurity doped thickness increases in proportion to the process time, the impurity doped thickness also increases by the increased impurity doped concentration.

However, when the emitter part 121 is formed by the ion implantation method, the maximum surface impurity doped concentration is greater than that of the thermal diffusion method, but the impurity doped thickness of the emitter part 121 decreases.

Thereby, when compared with the emitter part formed by the thermal diffusion method, the impurity doped thickness (depth) decreases and the maximum surface impurity doped concentration of the emitter part 121 increases.

By a built-in potential difference due to the p-n junction of the substrate 110 and the emitter part 121, a plurality of electrons and a plurality of holes produced by light incident on the substrate 110 move to the n-type semiconductor and the p-type semiconductor, respectively. Thus, when the substrate 110 is of the n-type and the emitter part 121 is of the p-type, the holes move to the emitter part 121 and the electrons move to the back surface of the substrate 110.

Because the substrate 110 and the emitter part 121 form the p-n junction, the emitter part 121 may be of the n-type when the substrate 110 is of the p-type unlike the example embodiment described above. In this instance, the electrons move to the emitter part 121, and the holes move to the back surface of the substrate 110.

When the emitter part 121 is of the p-type, the emitter part 121 may be formed by doping impurities of a group III element into the substrate 110. On the contrary, when the emitter part 121 is of the n-type, the emitter part 121 may be formed by doping impurities of a group V element into the substrate 110.

The anti-reflection layer 130 positioned on the emitter part 121 is made of hydrogenated silicon nitride (SiNx:H), hydrogenated silicon oxide (SiOx:H), or hydrogenated silicon oxy nitride (SiOxNy:H), etc.

The anti-reflection layer 130 reduces reflectance of light incident onto the substrate 110 and increases selectivity of a specific wavelength band, thereby increasing the efficiency of the solar cell 1. Further, by the hydrogen (H) supplied when the anti-reflection layer 130 is formed, the anti-reflection layer 130 performs a passivation function that converts a defect, for example, dangling bonds existing on the surface of the substrate 110 and around the surface of the substrate 110, into stable bonds to thereby prevent or reduce a recombination and/or a disappearance of charges moving to the front surface of the substrate 110 resulting from the defect. Hence, the anti-reflection layer 130 reduces loss of charges caused by disappearance of the charges due to the defect on or around the surface of the substrate 110, to further improve the efficiency of the solar cell 1.

In this example embodiment, the anti-reflection layer 130 has a single-layered structure, but the anti-reflection layer 130 may have a multi-layered structure such as a double-layered structure in other example embodiments. The anti-reflection layer 130 may be omitted, if desired.

The front electrode part 140 includes a plurality of front electrodes (a plurality of first electrodes) 141 and a plurality of front bus bars (a plurality of first bus bars) 142 connected to the plurality of front electrodes 141.

The plurality of front electrodes 141 are electrically and physically connected to portions of the emitter part 121 and extend substantially parallel to one another in a predetermined direction at a distance therebetween. The plurality of front electrodes 141 collect carriers (e.g., electrons) moving to the emitter part 121.

The plurality of front bus bars 142 are electrically and physically connected to portions of the first emitter part 121 and extend substantially parallel to one another in a direction crossing an extending direction of the front electrodes 141.

The front electrodes 141 and the front bus bars 142 are placed on the same level layer (or are coplanar). The front electrodes 141 and the front bus bars 142 are electrically and physically connected to one another at crossings of the front electrodes 141 and the front bus bars 142.

As shown in FIG. 1, the plurality of front electrodes 141 have a stripe shape extending in a transverse (or longitudinal) direction, and the plurality of front bus bars 142 have a stripe shape extending in a longitudinal (or transverse) direction. Thus, the front electrode part 140 has a lattice shape on the front surface of the substrate 110.

By the front electrode part 140, the anti-reflection layer 130 is not positioned on the portions of the emitter part 121 on which the front electrodes 141 and the front bus bars 142 are positioned, but is positioned on portion of the emitter part 121 between portions the front electrode part 140 (for example, portions between the front electrodes 141 and between the front bus bars 142).

The plurality of front bus bars 142 collect not only carriers transferred from portions of the emitter part 121 contacting the plurality of front bus bars 142 but also the carriers collected by the plurality of front electrodes 141.

Because the plurality of front bus bars 142 collect the carriers collected by the plurality of front electrodes 141 and move the carriers to a desired location, a width of each of the plurality of front bus bars 142 is greater than a width of each of the plurality of front electrodes 141.

When the plurality of front bus bars 142 are connected to an external device, the carriers (for example, electrons) collected by the front bus bars 142 are output to the external device.

The front electrode part 140 including the plurality of front electrodes 141 and the plurality of front bus bars 142 is formed of at least one conductive material, for example, silver (Ag).

Although FIG. 1 shows a predetermined number of front electrodes 141 and a predetermined number of front bus bars 142 on the substrate 110, the number of front electrodes 141 and the number of front bus bars 142 may vary.

The back surface field part 172 is a region (for example, a $p^+$-type region) that is more heavily doped than the substrate 110 with impurities of the same conductivity type as the substrate 110. Thus, the back surface field part 172 has a sheet resistance less than that of the substrate 110.

A potential barrier is formed by a difference between impurity concentrations of a first conductivity region of the substrate 110 and the back surface field part 172. Hence, the potential barrier prevents or reduces electrons from moving to the back surface field part 172 used as a moving path of holes and makes it easier for holes to move to the back surface field part 172. Thus, an amount of carriers lost by a recombination and/or a disappearance of the electrons and the holes at and near the back surface of the substrate 110 is reduced, and a movement of carriers to the back electrode part 150 increases by accelerating a movement of desired carriers (for example, holes).

The back electrode part 150 includes a back electrode (a second electrode) 151 and a plurality of back bus bars 152 connected to the back electrode 151.

The back electrode 151 contacts the back surface field part 172 positioned at the back surface of the substrate 110 and is positioned on the entire back surface of the substrate 110 except a formation area of the back bus bars 152. Thereby, the back electrode 151 is positioned at a portion of the back surface of the substrate 110, which is positioned between the back bus bars 152. However, if necessary or desired, the back electrode 151 may be not positioned at an edge of the back surface of the substrate 110 as well as the formation area of the back bus bars 152.

The back electrode 151 contains a conductive material such as aluminum (Al).

The back electrode 151 collects carriers (for example, holes) moving to the back surface field part 172.

Because the back electrode 151 contacts the back surface field part 172 having the impurity concentration higher than the substrate 110, a contact resistance between the substrate 110 (i.e., the back surface field part 172) and the back electrode 151 decreases. Hence, the carrier transfer efficiency from the substrate 110 to the back electrode 151 is improved.

The plurality of back bus bars 152 are positioned on the back surface of the substrate 110, on which the back electrode 151 is not positioned, and are connected to the back electrode 151.

Further, the plurality of back bus bars 152 are positioned opposite the plurality of front bus bars 142 with the substrate 110 therebetween. That is, the back bus bars 152 and the front bus bars 142 may be aligned, but such is not required.

The plurality of back bus bars 152 collect carriers from the back electrode 151 in the same manner as the plurality of front bus bars 142.

The plurality of back bus bars 152 are connected to the external device and output the carriers (for example, holes) collected by the back bus bars 152 to the external device.

The plurality of back bus bars 152 may be formed of a material having better conductivity than the back electrode 151. Further, the plurality of back bus bars 152 may contain at least one conductive material, for example, silver (Ag).

Alternatively, the back electrode 151 may be positioned on the entire back surface of the substrate 110. In this instance, the back bus bars 152 may be positioned opposite the front bus bars 142 with the substrate 110 therebetween on the back electrode 151. Further, the back electrode 151 may be positioned on substantially the entire back surface of the substrate 110 except the edge of the back surface of the substrate 110, if necessary or desired.

An operation of the solar cell 1 having the above-described structure is described below.

When light irradiated to the solar cell 1 is incident on the emitter part 121 and the substrate 110 through the anti-reflection layer 130, a plurality of electron-hole pairs are generated in the emitter part 121 and the substrate 110 by light energy based on the incident light. In this instance, because a reflection loss of the light incident on the substrate 110 is reduced by the textured surface of the substrate 110 and the anti-reflection layer 130, an amount of light incident on the substrate 110 further increases.

By the p-n junction of the substrate 110 and the emitter layer 121, the electrons and the holes move to the n-type semiconductor part (for example, the emitter part 121) and the p-type semiconductor part (for example, the substrate 110), respectively. The electrons moving to the n-type emitter part 121 are collected by the front electrodes 141 and the front bus bars 142 and then move to the front bus bars 142. The holes moving to the p-type substrate 110 are collected by the back electrodes 151 and the back bus bars 152 and then move to the back bus bars 152. When the front bus bars 142 are connected to the back bus bars 152 using electric wires, current flows therein to thereby enable use of the current for electric power.

Referring to FIGS. 3A to 3G, a method for the solar cell 1 according to an example embodiment of the invention is described.

Figure 3A:
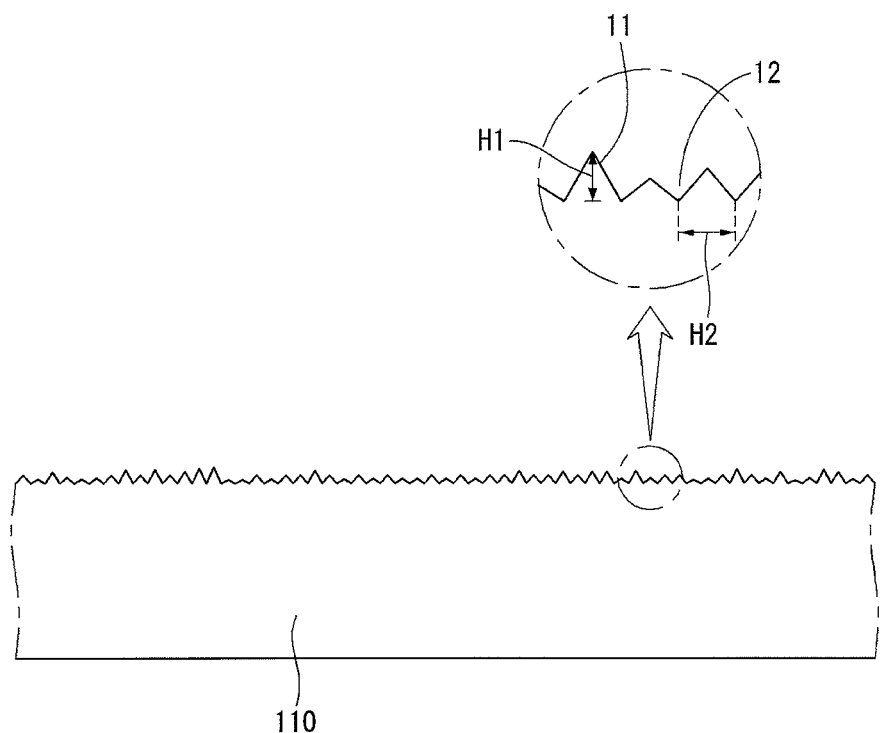
FIGS. 3A to 3G are cross-sectional views sequentially illustrating a method for manufacturing a solar cell according to an example embodiment of the invention.

As shown in FIG. 3A, by using a dry etching method such as a reaction ion etching (RIE) method, etc., or a wet etching method, an exposed surface, for example, a front surface of a substrate 110 of a first conductivity type is etched to form a textured surface (an uneven surface) having a plurality of projections 11 and a plurality of depressions 12. A projected height H1 of each projection 11 and a width H2 of each projection 11 are of various magnitudes, respectively.

Figure 3B:
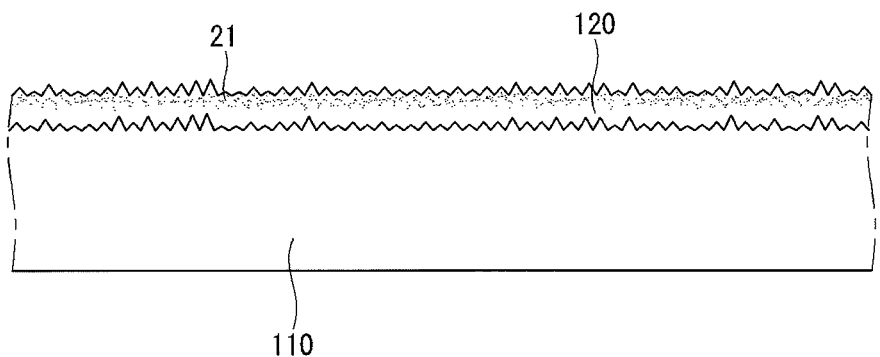

Next, as shown in FIG. 3B, by an ion implantation method, impurities are injected into only the front surface of the substrate 110 having the uneven surface, to form an impurity region 120. Since the impurities are of a second conductivity, for example, a n-type, opposite the first conductivity type, the impurity region 120 is of the second conductivity type. The impurity region 120 is a region obtained by injecting ions (that is, impurity ions) of the n-type impurities into the substrate 110 using the ion implantation method, and thereby, the impurity region 120 has a thickness measured from the front surface of the substrate 110. An energy for injecting the impurity ions may be about 5 KeW to 30 KeW.

When the impurity ions are injected into the substrate 110, the impurity ions come into collision with the front surface of the substrate 110 and thereby a damage portion 21 in which normal silicon bonds in the substrate 110 are broken is formed at and/or near the front surface of the substrate 110, that is, a surface of the impurity region 120. The damage portion 21 may be totally or partially formed at and/or near the entire front surface of the substrate 110 exposed to the impurity ions for the ion implantation method. The damage portion 21 is mainly formed at and near the surface of the substrate 110 but may be formed into the impurity region 120.

Since the injection of the impurity ions is performed only at the front surface of the substrate 110 which is exposed to the impurity ions, unlike a thermal diffusion method, the impurity region 120 is not formed at a back surface of the substrate 110.

Figure 3C:
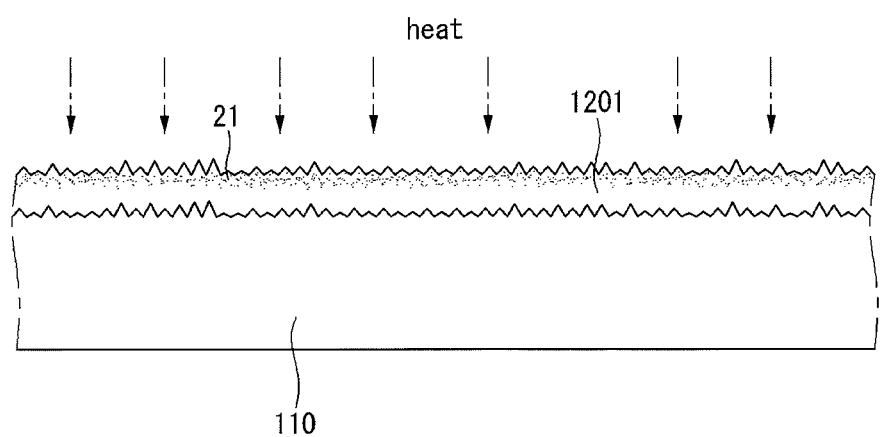

As shown in FIG. 3C, the substrate 110 is heated in an atmosphere of a nitrogen gas ($N_2$) to activate the impurity region 120 formed in the substrate 110, and to thereby, an emitter region 1201. That is, by the activation process using the heat treatment, the impurity ions existing in the impurity region 120 in an interstitial state are reconfigured with silicon (Si) such that a state of the impurity ions is changed from the interstitial state into a substitutional state. Thereby, the impurity region 120 functions as an emitter part of a p-type or an n-type and thereby, forms form a p-n junction with the first conductivity portion of the substrate 110.

Further, by the heat treatment, the impurity ions existing in the impurity region 120 is more deeply diffused into the substrate 110, and thereby a thickness (a depth) (that is, an impurity doped thickness) of the emitter region 1201 that is the activated impurity region is greater than a thickness of the impurity region 120. The heat treatment may be performed at about 800° C. to 1100° C. For example, when the impurity region 120 is of an n-type, for example, containing phosphorous (P), the heat treatment may be performed at about 800° C. to 1100° C. and when the impurity region 120 is of a p-type, for example, containing boron (B), the heat treatment may be performed at about 900° C. to 1100° C.

Figure 4:
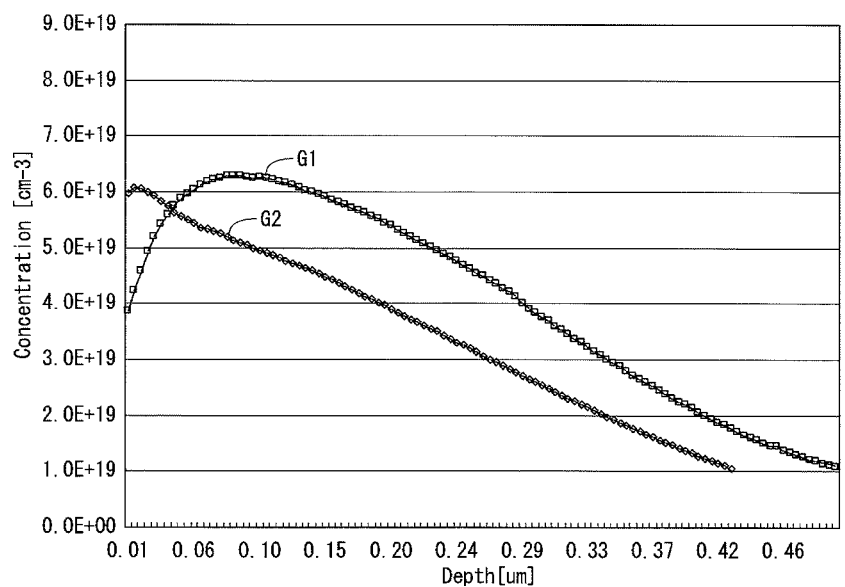
FIG. 4 shows graphs illustrating impurity doped concentrations depending on changes in depths of an emitter region and an emitter part according to an example embodiment of the invention.

An example of a variation of an impurity doped concentration of the emitter region 1201 is shown in a graph G1 of FIG. 4. The graph G1 of the FIG. 4 shows the impurity doped concentration in accordance with a thickness change of the emitter region 1201 from a surface of the emitter region 1201 to the back surface of the substrate 110.

As shown in the graph G1, the impurity doped concentration from the surface of the emitter region 1201 to a thickness of about 0.07 μm adjacent to the surface of the emitter region 1201 increases from about 4.0 E+19 cm$^{-3}$ to about 6.5 E+19 cm$^{-3}$ and the impurity doped concentration of the emitter region 1201 from a thickness of about 0.07 μm to a thickness about 0.48 μm gradually decreases from about 6.5 E+19 cm$^{-3}$ to about 4.0 E+19 cm$^{-3}$.

During the heat treatment for activating the impurity region 120, a recrystallization of silicon Si is performed at a recrystallization temperature of silicon, whereby damaged silicon lattices of the damaged portion 21 may be reconfigured. When the silicon recrystallization has occurred, the damaged silicon lattices in the damage portion 21 may be reconfigured into stable silicon lattices to anneal the damaged silicon lattices.

The activation process of the impurity region 120 may be performed in an atmosphere of an oxygen ($O_2$) gas. In this instance, a silicon oxide layer may be formed on the impurity region 120 by coupling oxygen of the atmosphere and silicon of the impurity region 120. The silicon oxide layer may have a thickness of about 15 nm to 30 nm.

Figure 5:
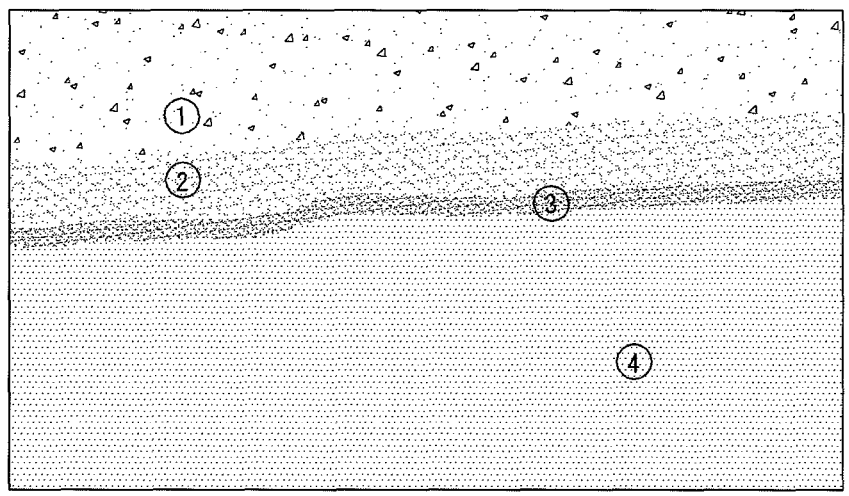
FIG. 5 depicts a damage portion existing at an emitter part in a solar cell according to an comparative example.

When forming the emitter region by using the ion implantation method, the damage portion existing on the emitter region is shown in FIG. 5.

FIG. 5 depicts a portion of a solar cell formed with an anti-reflection layer after forming an emitter region by the ion implantation and activation processes by using a TEM (transmission electron microscopy) equipment. The emitter region having the damage portion functions as an emitter part.

In FIG. 5, a reference numeral ④ denotes a silicon substrate, a reference numeral ③ denotes the damage portion formed at a surface of the silicon substrate, a reference numeral ② denotes a native silicon oxide portion generated by the exposure to an air, and a reference numeral ① denotes the anti-reflection layer.

Figure 3D:
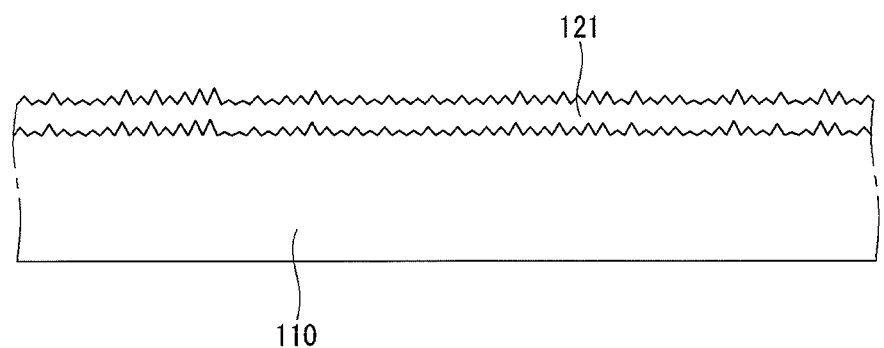

Next, referring to FIG. 3D, a surface (a front surface which is a surface opposite a p-n junction surface with the substrate 110 and the emitter region 1201) of the emitter region 1201, is removed to form an emitter part 121. By the removal, the entire surface of the emitter region 1201 is removed by a predetermined thickness and thereby the damage portion 21 formed at and/or near the surface of the emitter region 1201 is also removed. An impurity doped concentration of the emitter part 121 may be about $1\times10^{19}$ cm$^{-3}$ to $1\times10^{20}$ cm$^{-3}$.

A removed thickness of the impurity region 120 may be about 5 nm to 35 nm. For example, when the activation process is performed in the nitrogen atmosphere, a separate layer such as the silicon oxide layer is not formed on the emitter region 1201 activated by the nitrogen $N_2$. Thus, the emitter region 1201 is removed by a thickness of about 5 nm to 20 nm to further remove an amount greater than a thickness of the damage portion 21 existing at and/or near the surface of the emitter region 1201. However, when the activation process is performed in the oxygen atmosphere, since the silicon oxide layer formed on the emitter region 1201 as well as the damage portion 21 should be removed, the removal thickness increases. Thus, for example, the removed thickness of the emitter region 1201 may be about 20 nm to 35 nm.

As described above, since the emitter region 1201 is etched by an etchant and removed, and the entire front surface of the emitter region 1201 is exposed to the etchant, the thickness of the emitter portion 121 is reduced by the thickness removed from the emitter region 1201. In this instance, the removed thickness of the emitter region 1201 may be adjusted using a concentration of the etchant and/or an etching time, etc.

By the removal of a portion of the emitter region 1201 adjacent to the surface thereof, into which the impurity ions are injected, the impurity doped concentration of the emitter part 121 in accordance with a depth change of emitter portion 121 is varied as a graph G2 of FIG. 4.

For example, as shown in the graph G2 of FIG. 4, when a thickness of emitter part 121 from the surface of emitter part 121 is about 0.01 µm, the impurity doped concentration of the emitter part 121 has the maximum value, about 6.0 E+19 $cm^{-3}$, and then gradually decreases from about 6.0 E+19 $cm^{-3}$ to about 1.0 E+19 $cm^{-3}$. Thereby, the minimum impurity doped concentration of the emitter part 121 is about 1.0 E+19 $cm^{-3}$ and the thickness of the emitter part 121 having the minimum impurity doped concentration is about 0.42 µm.

Since the front surface of the emitter region 1201, at and/or near which the damage portion 21 exists is removed by a predetermined thickness, the thickness of the emitter part 121 is less than that of the emitter region 1201.

Thus, referring to FIG. 4, when the front surface of the emitter part 1201 is not removed, the thickness of the emitter region 1201 is about 0.47 µm, and the thickness of the emitter part 121 is about 0.42 µm after the front surface of the emitter region 1201 is removed.

For removing the entire front surface of the emitter region 1201 including the damage portion 21 by the predetermined thickness, an etch prevention layer is formed on a desired portion (for example, a back surface of the substrate 110 on which the etching is not desired) of the substrate 110 and then the substrate 110 is immersed into the etchant. Thus, the entire front surface of the emitter region 1201 on which the etch prevention layer is not formed is removed by the predetermined thickness, to remove the damage portion 21 existing at and/or near the surface of the emitter region 1201.

Alternatively, without the formation process of the etch prevention layer, the emitter region 1201 of the predetermined thickness may be removed by immersing a desired thickness of only the front surface of the substrate 110 (that is, the front surface of the emitter region 1201) into the etchant.

The etchant for removing the emitter region 1201 may be composed of nitric acid $HNO_3$, hydrofluoric acid HF and pure wafer. The nitric acid $HNO_3$ is used to oxygenate silicon composing the emitter region 1201 and the hydrofluoric acid HF is used to remove the oxygenated silicon.

When the heat treatment for activating the impurity region 120 is performed in the oxygen ($O_2$) atmosphere, the nitric acid $HNO_3$ may be omitted from the etchant. That is, since the impurity region 120 is oxygenated by oxygen ($O_2$) supplied during the heat treatment, the nitric acid $HNO_3$ oxygenating silicon Si is possible to omit. Further, as already described, the silicon oxide layer generated by the oxygenation of silicon on the impurity region 120 should be removed along with the emitter region 120, at least one of a concentration of the hydrofluoric acid HF and an etching time may be increased as compared with a case in which the impurity region 120 is activated in the nitrogen ($N_2$) atmosphere.

By the etching process of the emitter region 1201, the impurity doped concentration of the emitter portion 121 has the maximum value at and/or near the surface of the emitter portion 121 contacting the front electrode part 140. Thus, conductivity of regions of the emitter portion 121 contacting the front electrode part 140 increase. In addition, since the thickness of the emitter portion 121 decreases, charge transfer distances of charges moving to the surface of the emitter portion 121 are reduced. Thus, the charges further easily move from the emitter portion 121 to the front electrode part 140 adjacent to the emitter portion 121.

Figure 3E:
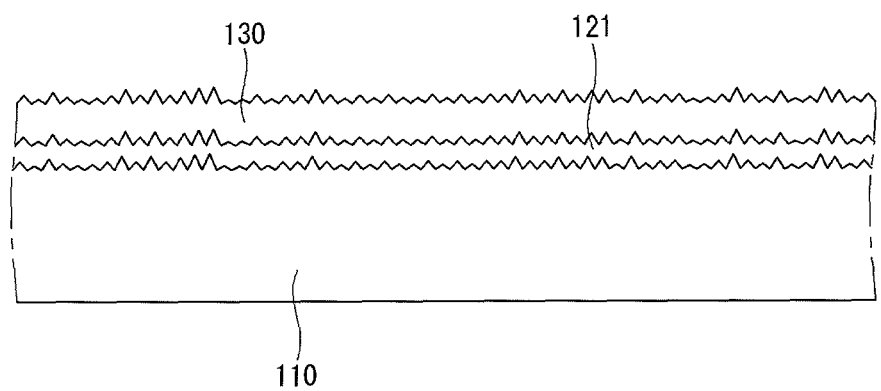

After forming the emitter portion 121 using the ion implantation method including the ion implantation process, the activation process and the etching process, as shown in FIG. 3E, an anti-reflection layer 130 is formed on the emitter part 121 on the front surface of the substrate 110 using a plasma enhanced chemical vapor deposition (PECVD), etc. In this example, the anti-reflection layer 130 may be made of hydrogenated silicon nitride (SiNx) or hydrogenated silicon oxide (SiOx) etc.

Figure 3F:
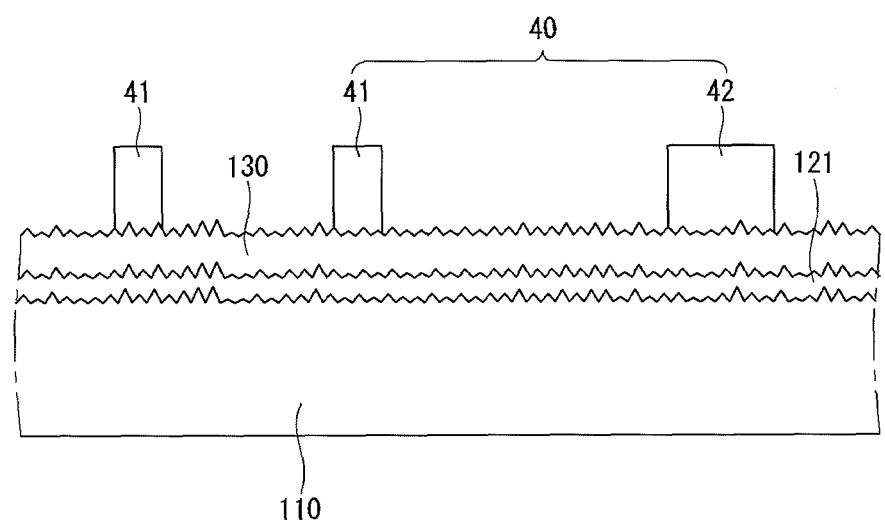

Next, referring to FIG. 3F, a paste containing metals such as silver (Ag) is printed on corresponding portions of the anti-reflection layer 130 using a screen printing method and then is dried to form a front electrode part pattern 40.

The front electrode pattern 40 includes a front electrode pattern 41 and a front bus bar pattern 42.

Figure 3G:
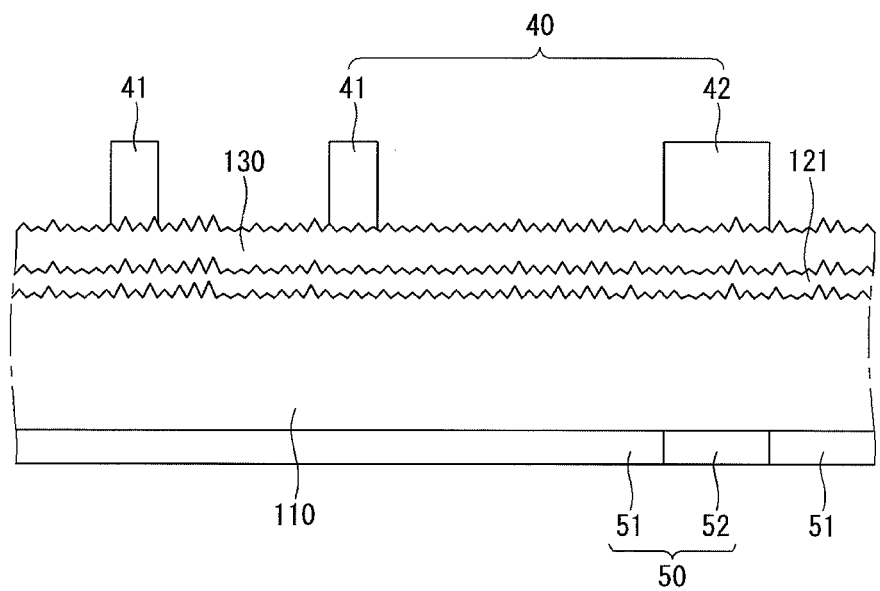

Next, referring to FIG. 3G, a paste containing metals such as aluminum (Al) is selectively or partially printed on the back surface of the substrate 110 using a screen printing method and then is dried to form a back electrode pattern 51 and a paste containing metals such as silver (Ag) is printed on portions of the back surface of the substrate 110 on which the back electrode pattern 51 is not formed using a screen printing method and then is dried to form a back bus bar pattern 52. Thereby, a back electrode part pattern 50 having the back electrode pattern 51 and the back bus bar pattern 52 is completed. The back bus bar pattern 52 is opposite the front bus bar pattern 42 with the substrate 110 therebetween.

The patterns 40 and 50 may be dried at about 120° C. to 200° C., and a formation order of the patterns 40 and 50 may be changed.

Next, the substrate 110 having the patterns 40 and 50 is heated at about 750 r to 800° C.

By the heat treatment, a front electrode part 140 having a plurality of front electrodes 141 and a plurality of front bus bars 142 electrically and physically connected to the emitter part 121, a back surface field part 172 at the back surface of the substrate 110 on which the back electrode pattern 51 is formed, and a back electrode part 150 including a back electrode 151 electrically connected to the substrate 110 through the back surface field part 172 and a plurality of back bus bars 152 electrically and physically connected to the substrate 110 and the back electrode 151 are formed, to complete a solar cell 1 (refer to FIGS. 1 and 2).

By the heat process, by an etching material such as lead (or PbO) contained in the front electrode pattern 41, the front electrode pattern 41 penetrates through portions of the anti-reflection layer 130 underlying the front electrode pattern 41 and is connected to the emitter part 121, thereby forming the plurality of front electrodes 141 and the plurality of front bus bars 142, to complete the front electrode part 140.

In this instance, the front electrode pattern 41 of the front electrode part pattern 40 is formed as the plurality of front electrodes 141 of the front electrode part 140, and the front bus bar pattern 42 of the front electrode part pattern 40 is formed as the plurality of front bus bars 142 of the front electrode part 140.

In addition, during the heat process, the back electrode pattern 51 and the back bus bar pattern 52 of the back electrode part pattern 50 are formed as the back electrode 151 and the plurality of back bus bars 152, respectively, and aluminum (Al) contained in the back electrode pattern 51 of the back electrode part pattern 50 is diffused (or doped) into the substrate 110 to form an impurity region, that is, the back surface field part 172 that is highly doped with impurities of the same conductivity type as the substrate 110. In this instance, an impurity doped concentration of the back surface field region 172 is higher than that of the substrate 110. The back electrode pattern 51 and the back bus bar pattern 52 do not contain an etching material (e.g., Pb). Even though the back electrode pattern 51 and the back bus bar pattern 52 contain the etching material, the back electrode pattern 51 and the back bus bar pattern 52 contains the etching material equal to or less than a predetermined amount (e.g., 1000 ppm) not influencing the etching of the underlying layer (that is, the substrate of the back electrode pattern 51 and the back bus bar pattern 52. Thus, unlike the front electrode part pattern 40, portions of the substrate 110 contacting the back electrode pattern 51 and the back bus bar pattern 52 are not etched during the thermal treatment process. Thereby, the back electrode 151 is in contact with the back surface field part 172 to be electrically connected to the substrate 110.

In this example, since by the ion implantation method, the emitter part 121 is formed only at (in) the front surface of the substrate 110 and is not formed at (in) the back surface of the substrate 110, characteristics of the back surface field part 172 are improved.

That is, when the emitter part 121 having the opposite conductivity type to the conductivity type of the substrate 110 is positioned at the back surface of the substrate 110, impurities having the opposite conductivity type and contained in the emitter part 121 are mixed to the back surface field part 172 of the same conductivity type as the substrate 110, and thereby a field effect by the back surface field part 172 is weakened.

However, in this instance, since the emitter part 121 is not formed at the back surface of the substrate, the reduction of the field effect of the back surface field part 172 due to the emitter part 121 does not occur and the field effect of the back surface field part 172 is further improved. Thus, an amount of charges moving to the back surface of the substrate 110 increases to improve an efficiency of the solar cell 1.

Moreover, in performing the heat process, metal components contained in the patterns 40 and 50 are chemically coupled to the contacted emitter part 121 and the substrate 110, respectively, such that a contact resistance is reduced and thereby a charge transfer efficiency is improved to improve a current flow.

Further, since the emitter part 121 is formed at only the front surface of the substrate 110, an edge isolation process separating the emitter part 121 formed in the front surface of the substrate 110 and the emitter part formed in the back surface of the substrate 110 or a separate process for removing the emitter part formed in the back surface of the substrate 110 are not necessary. Thus, a manufacturing time of the solar cell 1 is reduced to increase productivity of the solar cell 1 and a manufacturing cost of the solar cell 1 is also reduced.

Figure 6:
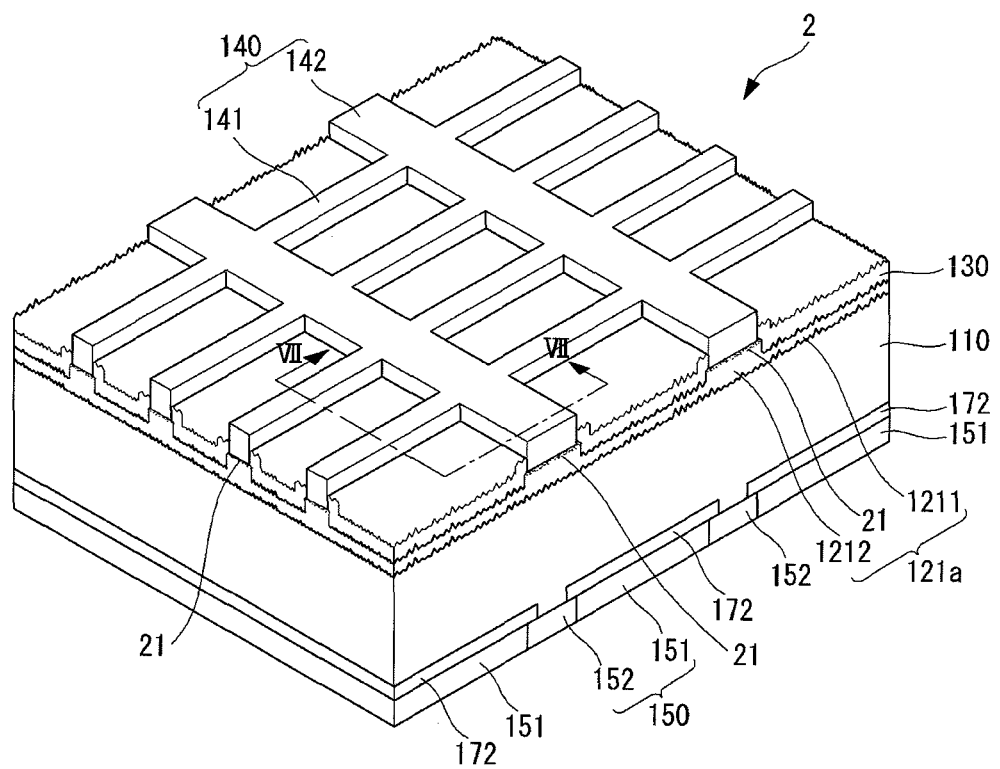
FIG. 6 is a partial perspective view of a solar cell according to another example embodiment of the invention.
Figure 7:
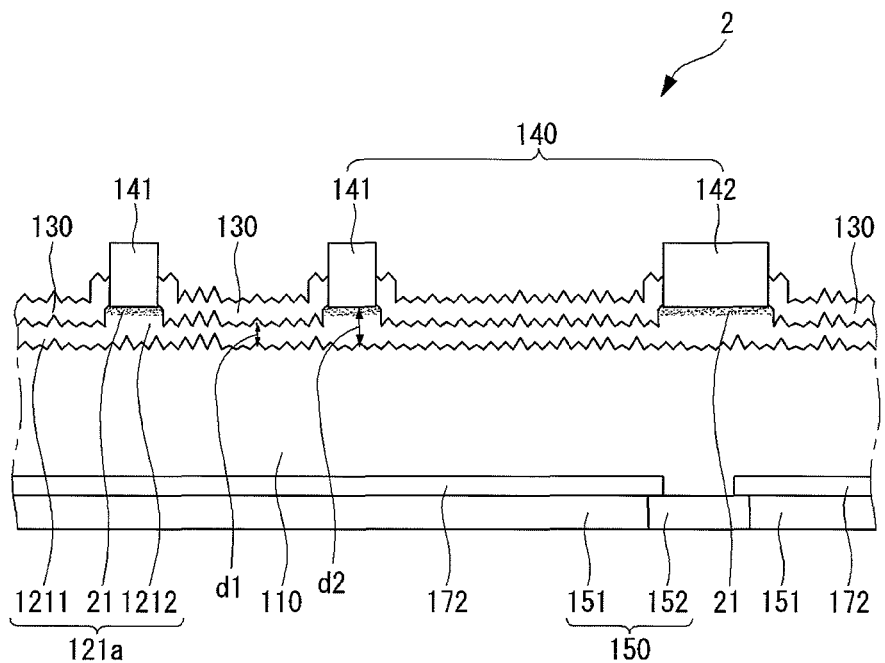
FIG. 7 is a cross-sectional view taken along line VII-VII of FIG. 6.

Next, referring to FIGS. 6 and 7, a solar cell according to another example embodiment of the invention is described.

A solar cell 2 shown in FIGS. 6 and 7 has the same structure as the solar cell of FIGS. 1 and 2 except an emitter part 121*a* and a front electrode part 140 connected to the emitter part 121*a*.

That is, the emitter part 121*a* includes first and second emitter portions 1211 and 1212 each having different impurity doped concentrations and different impurity doped thicknesses from each other. Thus, the solar cell 2 of the example includes a selective emitter structure.

In this example, the impurity doped thicknesses of the first emitter portion 1211 is less than the impurity doped thicknesses of the second emitter portion 1212, and thereby, the impurity doped concentration of the first emitter portion 1211 is less than the impurity doped concentration of the second emitter portion 1212. Thus, conductivity of the second emitter portion 1212 is greater than that of the first emitter portion 1211 and a sheet resistance of the second emitter portion 1212 is less than that of the first emitter portion 1211.

An amount (that is, a damage amount) of damage portion generated at and/or near a surface of the second emitter portion 1212 in injecting impurity ions is more than an amount (a damage amount) of damage portion generated at and/or near a surface of the first emitter portion 1211. Thus, the damage amount existing at the second emitter portion 1212 is more than that of the first emitter portion 1211. In particular, the damage amount existing at and/or near the surface of the second emitter portion 1212 is more than that at and near the surface of the first emitter portion 1211.

When comparing a TEM photograph of the second emitter portion 1212 and a TEM photograph of the first emitter portion 1211, the damage amount observed in the TEM photograph of the second emitter portion 1212 is more than that observed in the TEM photograph of the first emitter portion 1211. Thus, the damage amounts of the first and second emitter portions 1211 and 1212 may be measured by using a TEM equipment. As another method for measuring the damage amount of the first and second emitter portions 1211 and 1212, a CV (capacitance voltage) measurement equipment may be used. For example, charge mobility or leakage current in the first and second emitter portions 1211 and 1212 is measured by the CV measurement equipment and the damage amounts of the first and second emitter portions 1211 are calculated based on the charge mobility or leakage current. In general, as the damage amount increases, the leakage current increases and the charge mobility decreases.

In this example, the front electrode part 140 is connected to the second emitter portion 1212 of the emitter part 121*a* having the conductivity more than that of the first emitter portion 1211.

Since the front electrode part 140 is connected to the second emitter portion 1212, charges transferring to the emitter part 121*a* move to the surface of the first emitter portion 1211 and then move to the front electrode part 140 along the surface of first emitter portion 1211. In this instance, since the impurity doped thickness of the first emitter portion 1211 is less than that of the second emitter portion 1212, the charge transfer distances of charges moving to the surface of the first emitter portion 1211 are reduced. Thus, an amount of charges collected by the front electrode part 140 increases and an efficiency of the solar cell 2 is improved.

Since the first emitter portion 1211 through which charges mainly move to adjacent portions of the front electrode part 140 has the impurity doped concentration less than that of the second emitter portion 1212, when the charges move from the first emitter portion 1211 to the second emitter portion 1212, a loss amount of the charges due to the impurities of the first emitter portion 1211 decreases and mobility of the charges increases. Thus, an amount of charges moving from the first emitter portion 1211 to the second emitter portion 1212 increases.

Further, since the front electrode part 140 is connected to the second emitter portion 1212 having larger conductivity and less resistance than the first emitter portion 1211, a charge transfer efficiency from the second emitter portion 1212 and the front electrode part 140 is increased. Thus, the efficiency of the solar cell 1 is improved.

As described above, the impurity doped concentration of the second emitter portion 1212 formed by the ion implantation method is greater than that of a second emitter portion formed by the thermal diffusion method. Thus, the conductivity of the second emitter portion 1212 contacting the front electrode part 140 is greater than that of the second emitter portion formed by the thermal diffusion method, and thereby, contact resistance between the second emitter portion 1212 and the front electrode part 140 further decreases. Thereby, an amount of charges transferring from the second emitter portion 1212 to the front electrode part 140 increases and an amount of charges collected by the front bus bars 142 also increases.

As described above, since the first and second emitter portions 1211 and 1212 are different impurity doped thicknesses from each other, a distance (hereinafter, referred to as 'a first shortest distance') d1 from the front surface of the substrate 110 to a p-n junction surface (hereinafter, referred to as 'a first junction surface') between the first emitter portion 1211 and the substrate 110 is different from a distance (hereinafter, referred to as 'a second shortest distance') d2 from the front surface of the substrate 110 to a p-n junction surface (hereinafter, referred to as 'a second junction surface') d2 between the second emitter portion 1212 and the substrate 110. That is, as shown in FIGS. 6 and 7, the first shortest distance d1 is shorter than the second shortest distance d2.

In the substrate 110, the first and second junction surfaces are positioned at the same level (i.e., the same height) as each other. Thus, a third shortest distance from the back surface of the substrate 110 to the first junction surface is substantially equal to a fourth shortest distance from the back surface of the substrate 110 to the second junction surface. In this instance, the first to fourth shortest distances are substantially equal to each other within the margin of error obtained by a difference between the heights of each projection of the textured surface of the substrate 110.

Since the emitter part 121 is formed at the front surface of the substrate which is the textured surface, the junction surface between the substrate 110 and the emitter part 121a may be not a flat surface but an uneven surface under the influence of the textured surface of the substrate 110.

As described above, since the front electrode part 140 is connected to only the second emitter portion 1212 of the emitter part 121a, the anti-reflection layer 130 is mainly positioned on the first emitter portion 1211 of the emitter part 121a positioned between portions of the front electrode part 140.

The emitter part 121a may be formed as discussed below.

As described referring to FIGS. 3A to 3C, after forming a textured surface at a front surface of the substrate 110, an emitter region 1201 is formed by an ion implantation method and an activation process. The emitter region 1201 has a damage portion 21 existing at at least one of a surface of the emitter region 1201.

Figure 8A:
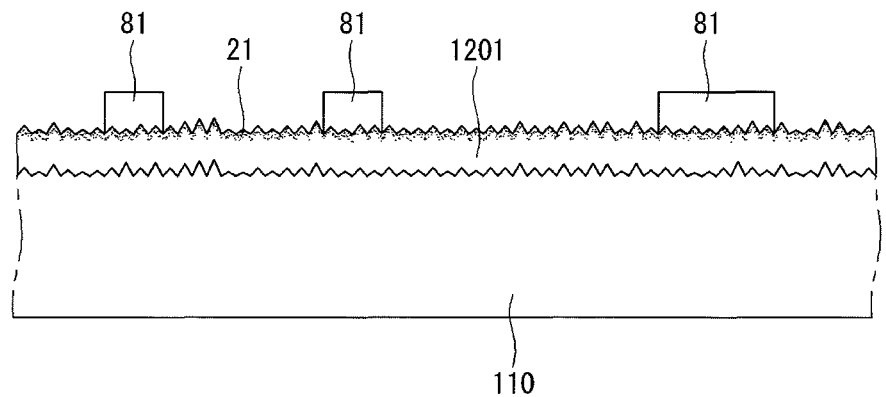
FIGS. 8A to 8D are cross-sectional views illustrating portions of processes for manufacturing the solar cell shown in FIGS. 6 and 7.

Next, as shown in FIG. 8A, an etch protection layer 81 is selectively or partially formed on the emitter region 1201 to expose portions of the emitter region 1201 on which the etch protection layer 81 is not formed.

Figure 8B:
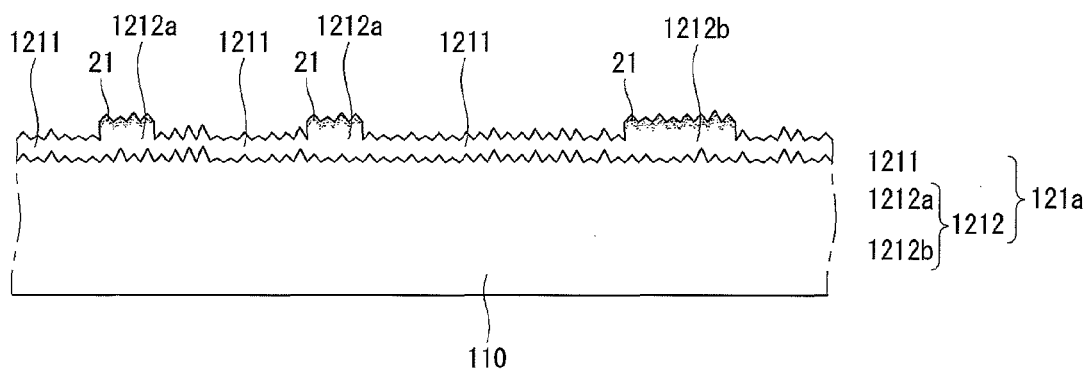

As shown in FIG. 8B, the front surface of the substrate 110 is exposed to an etchant, to remove the exposed portions of the emitter region 1201 by a predetermined thickness (a desired thickness).

The etchant may be composed of nitric acid $HNO_3$, hydrofluoric acid HF and pure wafer, etc., or may be composed of the hydrofluoric acid HF and pure wafer, excluding the nitric acid $HNO_3$.

Thus, a portion etched of the emitter region 1201 is formed as the first emitter portion 1211 and a portion not etched of the emitter region 1201 is formed as the second emitter portion 1212, to form an emitter part 121a (FIG. 8B). Then, the etch protection layer 81 is removed by a cleansing liquid such as water, etc. Since a reason for removing the portions of the emitter region 1201 is to form the first emitter portion 1211 having a thickness less than that of the second emitter portion 1212, a removed thickness of the emitter region 1201 may be about 30 nm to 100 nm.

The second emitter portion 1212 includes a portion 1212a (a front electrode second emitter portion) for a plurality of front electrodes extending in a predetermined direction and a portion (a front bus bar second emitter portion) 1212b for a plurality of front bus bars extending in a direction crossing the front electrode second emitter portion 1212a. A width of the front bus bar second emitter portion 1212b is greater than that of the front electrode second emitter portion 1212a.

In an alternative example, the etch protection layer 81 may be formed on the back surface as well as the front surface of the substrate 110, and then the entire surface of the substrate 110 may be exposed to the etchant to form a selective emitter structure having the first and second emitter portions 1211 and 1212.

Thereby, since the damage portion 21 existing at and/or near the front surface of the emitter region 1201 for the first emitter portion 1211 is removed, the first emitter portion 1211 may have an impurity doping graph such as a shape of the graph G2 of FIG. 4, an impurity doped thickness of first emitter portion 1211 is reduced by the removed thickness of the emitter region 1201. Thereby, an impurity doped thickness of the first emitter portion 1211 is less than that of the second emitter portion 1212 at which the etching is not performed. In this instance, the second emitter portion 1212 may have an impurity doping graph such as a shape of the graph G1 of FIG. 4 since portions of the emitter region 1201 corresponding to the second emitter portion 1212 are not removed. Thereby, since the surface of the emitter region 1201 having a higher impurity doped concentration than other portion of the emitter region 1201 is removed, a surface impurity doped concentration at the surface of the first emitter portion 1211 is less than that of the second emitter portion 1212. For example, the surface impurity doped concentration of the first emitter portion 1211 may be about $2 \times 10^{19}$ $cm^{-3}$ and the surface impurity doped concentration of the second emitter portion 1212 may be about $4 \times 10^{19}$ $cm^{-3}$.

Thus, the impurity doped thickness of the first emitter portion 1211 is reduced, and the charge transfer distance of charges moving to the surface of the first emitter portion 1211 decreases.

Figure 8C:
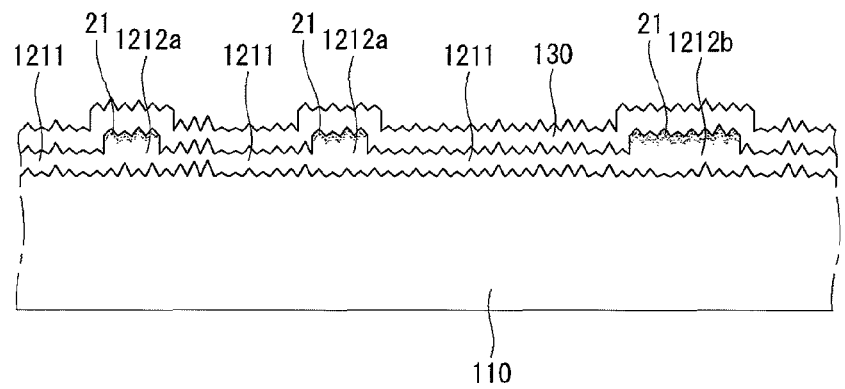

Next, as shown in FIG. 8C, an anti-reflection layer 130 is formed on the entire front surface of the substrate 110, that is, on the first emitter portion 1211 and the second emitter portion 1212 of the emitter part 121a.

Since the anti-reflection layer 130 is positioned on the first emitter portion 1211 at which the damage portion 21 of the emitter region 1201 is removed, both a reduction effect of a charge loss due to the damage portion 21 and a passivation effect by the anti-reflection layer 130 are obtained at the first emitter portion 1211. Thus, a loss amount of charges moving from first emitter portion 1211 to the second emitter portion 1212 is further reduced.

Figure 8D:
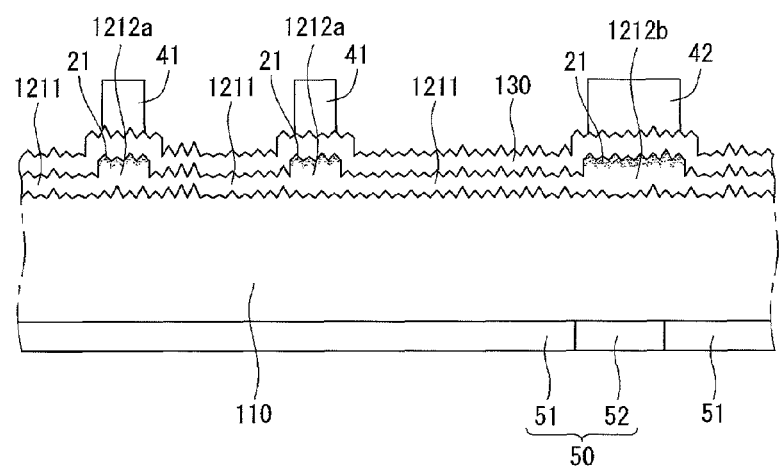

As described referring to FIG. 8D, a paste containing silver (Ag) and an etching material is printed on the second emitter portion 1212 and then is dried to form a front electrode part pattern 40 having a front electrode pattern 41 and a front bus bar pattern 42, and a paste containing aluminum (Al) and a paste containing silver (Ag) are printed on the back surface of the substrate 110 and then are dried to form a back electrode part pattern 50 having a back electrode pattern 51 and a back bus bar pattern 52 (referring to FIG. 8D.) The front electrode pattern 41 is formed on and along the front electrode second emitter portion 1212a and the front bus bar pattern 42 is formed on and along the front bus bar second emitter portion 1212b.

Then, in the same manner as described above, by heating the substrate 110 with the pattern 40 and 50, a front electrode part 140 having a plurality of front electrodes 141 and a plurality of first bus bars 142 penetrating the anti-reflection layer 130 and contacting the second emitter portion 1212, a back surface field part 172, that is highly doped with impurities of the same conductivity type as the substrate 110, a back electrode part 150 including a back electrode 151 contacting the back surface field part 172 and electrically connected to the substrate 110 through the back surface field part 172 and a plurality of back bus bars 152 electrically and physically connected to the substrate 110 and the back electrode 151 are formed. Thereby, the solar cell 2 is completed.

When an activation process for forming the emitter region 1201 is performed in an oxygen atmosphere, a silicon oxide layer may be formed on the second emitter portion 1212. However, when the front electrode pattern 40 penetrates the anti-reflection layer 130 for forming the front electrode part 140, the silicon oxide layer underlying the anti-reflection layer 130 is also penetrated by the front electrode part pattern 40. Thereby, the silicon oxide layer generated during the activation process does not negatively influence the contact between the front electrode part 140 and the emitter part 121a.

Figure 9:
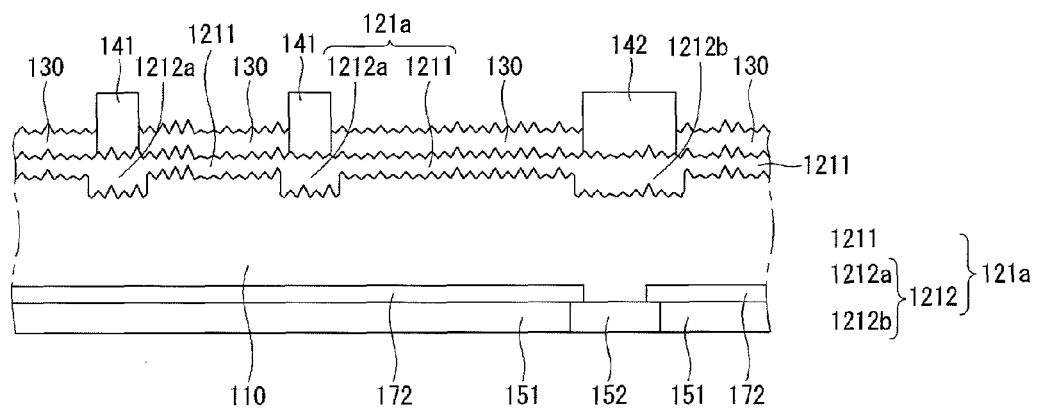
FIG. 9 is a partial cross-sectional view of a solar cell according to yet another example embodiment of the invention.

Another example of the selective emitter structure of the solar cell is shown in FIG. 9.

As shown in FIG. 9, an emitter part 121a having first and second emitter portions 1211 and 1212 has a different structure from the emitter part 121a of FIGS. 6 and 7.

That is, in FIGS. 6 and 7, a p-n junction surface of the first emitter portion 1211 is the same level as a p-n junction surface of the second emitter portion 1212, and the second emitter portion 1212 having the impunity doped thickness greater than that of the first emitter portion 1211 is projected toward the substrate 110. Thus, a surface (i.e., a front surface, that is, an opposite surface of the p-n junction surface) of the first emitter portion 1211 and a surface (i.e., a front surface, that is, an opposite surface of the p-n junction surface) of the second emitter portion 1212 are not positioned at the same level (i.e., the same height) as each other and thereby, the surface (the front surface) of the emitter part 121a is not a flat surface but an uneven surface having projections at which the second emitter portion 1212 is projected to the incident surface of the substrate 110. Thereby, a front surface position of the second emitter portion 1212 is higher than that of the first emitter portion 1211.

However, in FIG. 9, a surface (i.e., front surface) of the first emitter portion 1211 and a surface (i.e., a front surface) of the second emitter portion 1212 are positioned at the same level (i.e., the same height) and thereby, the front surface of the emitter part 121a is substantially level. However, a p-n junction of the first emitter portion 1211 and a p-n junction of the second emitter portion 1212 are not of the same level, but are positioned at different positions (i.e., different heights), respectively. Thus, a front position of the first emitter portion 1211 is equal to the front position of the second emitter portion 1212 and the p-n junction surface of the second emitter portion 1212 is projected from the p-n junction of the first emitter portion 1211 to the back surface of the substrate 110.

The p-n junction of the emitter part 121a is an uneven surface having projections at which the second emitter portion 1212 is projected to the back surface of the substrate 110.

Functions of the first and second emitter portions 1211 and 1212 of the solar cell shown in FIG. 9 are equal to that of the first and second emitter portions 1211 and 1212, and thereby the functions of the first and second emitter portion 1211 and 1212 are not described in detail.

A method for manufacturing the emitter part 121a is described below.

Figure 10A:
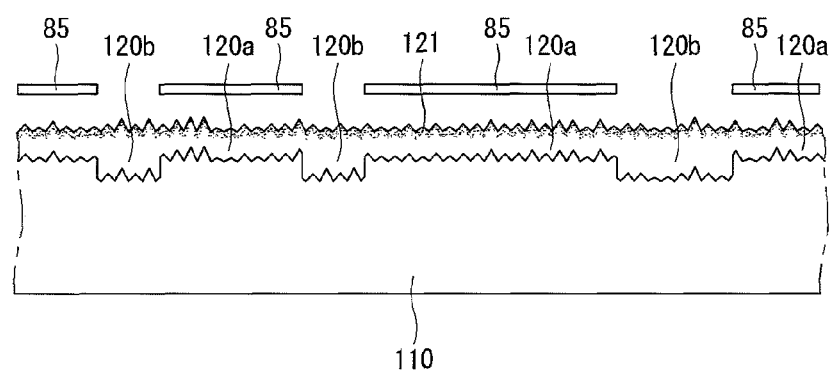
FIGS. 10A to 10C are cross-sectional views illustrating portions of processes for manufacturing the solar cell shown in FIG. 9.

As described referring to FIG. 10A, first and second impurity portions 120a and 120b which are of a second conductivity type are formed at a front surface of the substrate 110 by injecting impurity ions of the second conductivity type using an ion implantation method. The first impurity portion 120a has different impurity doped concentration and impurity doped thickness from the second impurity portion 120b. The first and second impurity portions 120a and 120b are an impurity region.

The first and second impurity portions 120a and 120b having different impurity doped thicknesses from each other are formed by using a mask 85. The mask 85 may be equipped to an ion implantation equipment for the ion implantation method. An amount of ions injected into portions of the substrate 110 over which the mask 85 is positioned is less than an amount of ion injected into the remaining portion of the substrate 110 over which the mask 85 is not positioned. Thus, the portions of the substrate 110 corresponding the mask 85 is formed as the first impurity portion 120a, and the remaining portion of the substrate 110 (that is, portions over which the mask 85 is not positioned) are formed as the second impurity portion 120b.

As another example for manufacturing the first and second impurity portions 120a and 120b, the mask 85 may be formed on the entire front surface of the substrate 110. In this instance, an exposed area of the substrate 110 exposed through the mask 85 in a unit area thereof is changed depending on positions of the substrate 110. For example, the mask 85 may include a first portion having a first exposed area of the substrate 110 in the unit area and a second portion having a second exposed area of the substrate 110 in the unit area, and the second exposed area is greater than the first exposed area. Thereby, when, by using an ion implantation method, impurity ions are applied on the mask 85 having the first and second portions and positioned over the entire front surface of the substrate 110, a portion of the substrate 110 facing the first portion of the mask 85 may be formed as the first impurity portion 120a having a first impurity doped thickness (concentration) and a portion of the substrate 110 facing the second portion of the mask 85 may be formed as the second impurity portion 120b having a second impurity doped thickness (concentration) greater than the first impurity doped thickness (concentration).

The mask 85 having the first and second portions may be positioned directly on the substrate 110, and the first and second impurity portions 120a and 120b may be formed at the substrate 110 in the same manner as that described above.

Alternatively, after forming a first impurity portion 120a having a desired impurity doped thickness at the entire front surface of the substrate 110, impurity ions being further selectively or partially injected at the first impurity portion 120a by using a mask such that portions of the first impurity portion 120a are formed as the second impurity portion 120b. In this instance, the second impurity portion 120b is the portion of the substrate 110 at which the impurity ions are further injected, and the first impurity portion 120*a* is the remaining portion of the substrate 110 at which the impurity ions are not further injected.

Further, the first and second impurity portions 120*a* and 120*b* may be formed by using various known methods using the ion implantation method.

Since the first and second impurity portions 120*a* and 120*b* are formed by using the ion implantation method, a damage portion 21 due to the impurity ions is generated at and/or near surfaces (front surfaces) of the first and second impurity portions 120*a* and 120*b*.

Figure 10B:
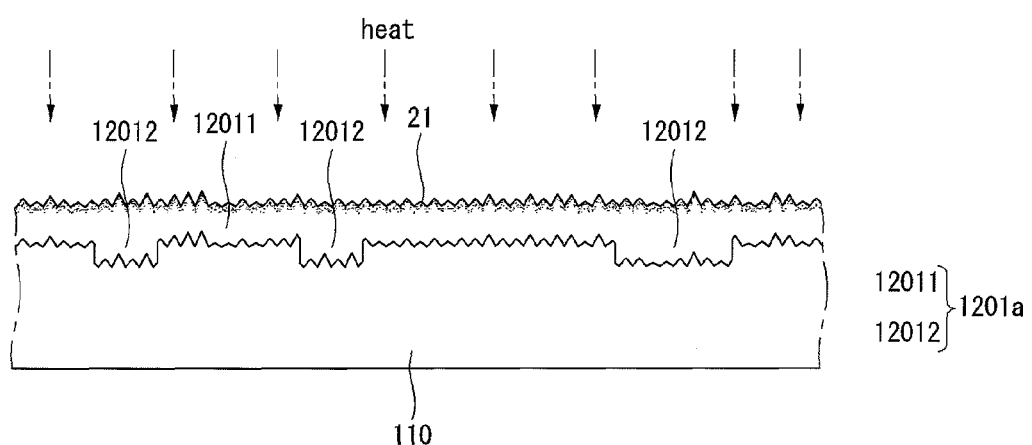

Next, as shown in FIG. 10B, the front surface of the substrate 110 having the first and second impurity portions 120*a* and 120*b* is heated in a nitrogen ($N_2$) or oxygen ($O_2$) atmosphere and thereby the first and second impurity portions 120*a* and 120*b* are formed as first and second emitter regions 12011 and 12012 of the emitter region 1201*a*, respectively. In this instance, the damage portion 21 still exists at and/or near a front surface of the emitter region 1201*a*.

Figure 10C:
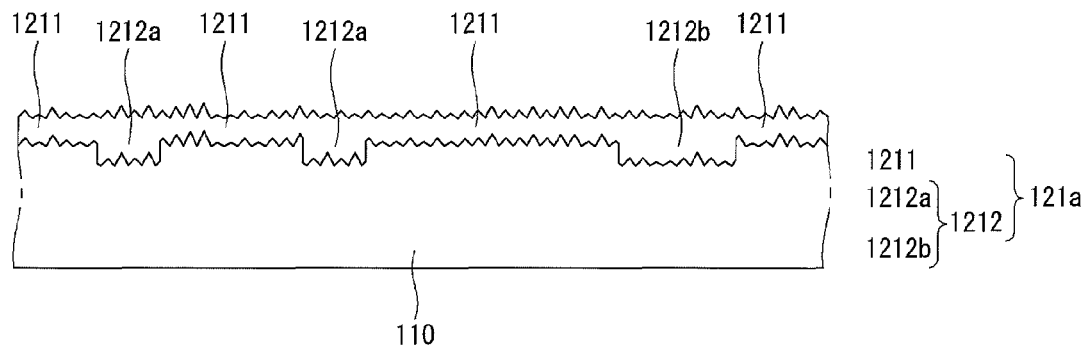

Next, the entire front surface of the emitter region 1201*a* is etched by an etchant and then removed to a desired thickness (a predetermined thickness). In this instance, the damage portion 21 existing at and/or near the front surface of the emitter region 1201*a* is removed by the etchant. Thereby, an emitter part 121*a* having the first and second emitter portions 1211 and 1212 is completed (FIG. 10C). Since the removal of the emitter region 1201*a* is enough to remove the portion at and/or near the entire front surface of the emitter region 1201*a*, at which the damage portion 21 largely exists is removed, a removed thickness of the emitter region 1201*a* may be 5 nm to 35 nm.

The thicknesses of the first and second emitter portions 1211 and 1212 of the emitter part 121*a* are less than thicknesses of the first and second emitter regions 12011 and 12012 of the emitter region 1201*a*, respectively, and the damage portion 21 is removed and does not exist at and/or near not only the first emitter portion 12011 but also at the second emitter portion 12012.

Since all the first and second emitter regions 12011 and 12012 are removed by the etchant, variations of the impurity doped concentrations of the first and second emitter portions 1211 and 1212 in accordance thickness variations of the first and second emitter portions 1211 and 1212 have shapes as the graph G2 of FIG. 4, respectively. Further, a surface impurity doped concentration of the first emitter portion 1211 is less than a surface impurity doped concentration of the second emitter portion 1212.

Next, formation processes of an anti-reflection layer 130, a front electrode part 140, a back electrode part 150, and a back surface field part 172 are equal to the processes described referring to FIGS. 8C and 8D.

The process for forming the emitter part 121 by using the ion implantation process, the activation process and the etching process may be adopted for manufacturing the back surface field part 172.

That is, after forming an impurity portion of a first conductivity type at a back surface of the substrate 110 by injecting impurity ions of the first conductivity type into the back surface of the substrate 110 in the same manner as described above, the impurity portion of the first conductivity type is activated by heating at a predetermined temperature (for example, about 800° C. to 1100° C.) to form the impurity portion of the first conductivity type into a back surface field region. The back surface field region includes a damage portion due to the impurity ions at and/or near a surface of the back surface field region. Then, the back surface field region is removed by a predetermined (desired) thickness from the surface of back surface field region to form the back surface field part 172 at the back surface of the substrate 110. The removal of the back surface field region is performed by the etchant described above, and the damage portion of the back surface field region is removed during removing of the back surface field region.

For reducing or preventing deterioration of the substrate 110 by the heat treatment process for the activation process, after forming the impurity portion of the second conductivity type for the emitter part 121 and the impurity portion of the first conductivity type for the back surface field part 172 at the front and back surfaces of the substrate 110, respectively, the impurity portions formed at the front and back surfaces of the substrate 110 may be simultaneously activated by one heat treatment process to form the emitter part 121 and the back surface field part 172.

Since the back surface field part 172 is not formed during forming of the back electrode part 150 but formed by a separate process such as the ion implantation process, the back surface field part 172 is further stably formed and the impurity doped concentration of the back surface field part 172 is further accurately controlled. As described above, when the back surface field part 172 is formed by the ion implantation method, a surface impurity doped concentration of the back surface field part 172 is greater than that of a back surface field part formed by heat applied during forming the back electrode part 150, and thereby, contact resistance between the back surface field part 172 and a back electrode 151 is reduced to increase an amount of charges moving from the substrate 110 to the back electrode 151.

After at least one of the emitter part 121 and the back surface field part 172 is formed by the ion implantation process, the activation process and the etching process, an anti-reflection layer 130, a front electrode part 140 and a back electrode part 150 are formed as described referring to FIGS. 3E to 3G. Since the back surface field part 172 is already formed before the formation of the front and back electrode parts 140 and 150, the further generation of the back surface field part 172 should be prevented during forming the back electrode 151. For example, a material of a back electrode pattern for forming the back electrode 151 may be changed, or after the formation of the front electrode part 140, the back electrode part 150 should be formed at a low temperature not to further generate the back surface field part 172 by the back electrode pattern.

Figure 11:
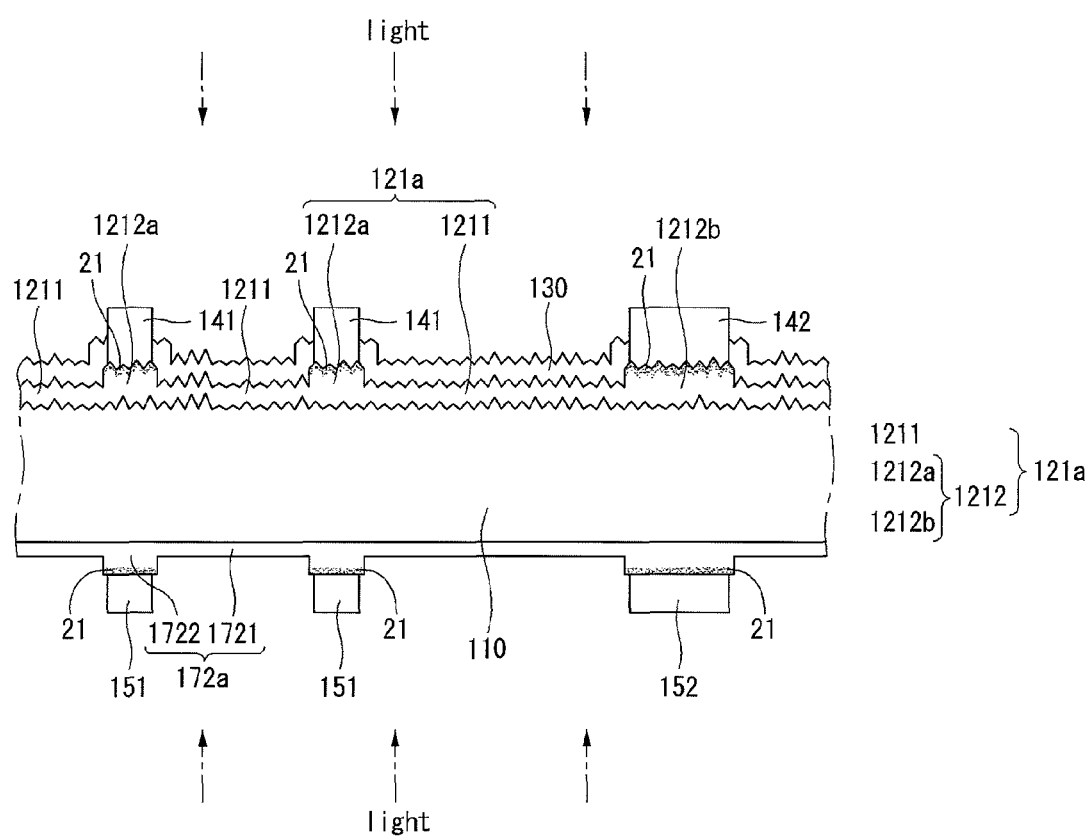
FIG. 11 is a partial cross-sectional view of a solar cell according to yet another example embodiment of the invention.

Further, as shown in FIG. 11, at least one of the emitter part 121*a* and the back surface field part 172*a* formed by the ion implantation process, the activation process, and the etching process is applied to a bifacial solar cell of which light is incident on front and back surfaces.

As shown in FIG. 11, in the same method as shown in FIGS. 6 and 7 and referring to FIGS. 8A to 8C and 10A to 10C, the emitter part 121*a* of the selective emitter structure includes the first and second emitter portions 1211 and 1212, and a back surface field part 172*a* of a selective back surface field structure includes first and second back surface field portions 1721 and 1722.

All the first and second back surface field portions 1721 and 1722 have impurity doped concentrations greater than an impurity doped concentration of the substrate 110. The second back surface field portion 1722 has the impurity doped concentration greater than that of the first back surface field portions 1721, and thus the second back surface field portion 1722 has conductivity greater than that of the first back surface field portions 1721.

Like a plurality of front electrodes 141, the back electrode includes a plurality of electrodes 151 extending substantially parallel to one another in a predetermined direction (that is, in the same direction as the front electrodes 141) at a distance therebetween, and a back bus bar also includes a plurality of back bus bars 152 extending in a direction (that is, in the same direction as the front bus bars 142) crossing the plurality of back electrodes 151. In this instance, the plurality of back electrodes 151 may face the plurality of front electrodes 141 with the substrate 110 therebetween and the plurality of back bus bars 152 may face the plurality of front bus bars 142 with the substrate 110 therebetween.

When the solar cell have the selective back surface field structure, contact resistance between the second back surface field portion 1722 and the back electrodes 151 is reduced and an amount of charges moving from the second back surface field portion 1722 to the back electrodes 151 increases, and when the charges move along a surface of the first back surface field portion 1721 to the second back surface field portion 1722, a loss amount of the charges due to the impurities is decreased, to increase an amount of the charges moving from the first back surface field portion 1721 to the second back surface field portion 1722.

In this instance, even though the conductivity types of the emitter part 121a and the back surface field part 172a are different from each other, methods for forming the selective emitter structure and the selective back surface field structure are equal to the processes of FIGS. 8A to 8C or FIGS. 10A to 10C. That is, as described, impurity ions for forming the emitter part 121a injected into the substrate 110 has a second conductivity type different from that of the substrate 110, but impurity ions for forming the back surface field part 172a injected into the substrate 110 has a first conductivity type equal to that of the substrate 110.

Thus, when the selective back surface field structure is formed in the manner shown in FIGS. 8A to 8C, a back surface field region of the first conductivity type at the back surface of the substrate 110 is formed, and then an etch prevention layer is selective or partially formed on the back surface field region to expose portions of the back surface field region. Then the exposed portions of the back surface field region are removed from a surface of the back surface field region by a predetermined thickness and the etch prevention layer is removed. Thus, etched portions of the back surface field region is formed as the first back surface field portion and the remaining portion (that is, portions of back surface field region on which the etch prevention layer is positioned) of the back surface field region is formed as the second back surface field portion. When the portions of the back surface field region are removed, a damage portion existing at the etched portion of the back surface field region is also removed.

When the selective back surface field structure is formed in the manner shown in FIGS. 10A to 10C, a first impurity portion having a first impurity doped thickness (concentration) and a second impurity portion having a second impurity doped thickness (concentration) greater than the first impurity doped thickness (concentration) are formed by using a mask 85 equipped an ion implantation equipment or positioned directly on the substrate 110, or a first impurity portion of the first conductivity type may be formed at the entire front surface of the substrate 110 by the ion implantation method, and then impurity ions of the first conductivity type may be further selectively or partially injected into the first impurity portion, to form portions of the first impurity portion as a second impurity portion.

Next, a heat treatment is performed on the first and second impurity portions to form a back surface field region of first and second back surface field regions, and the back surface field region is removed by a predetermined thickness to form the back surface field part 172a including the first and second back surface field portions. Since the back surface field region includes a damage portion at and/or near the back surface field region, the damage portion is removed during removing of the back surface field region.

In an alternative example, the back surface field part of the bifacial solar cell is in contact with only the back electrode 151 and the back bus bars 152, and in this instance, when the back bus bars 152 are omitted, the back surface field part contacts only the back electrodes 151. That is, the back surface field part may be not positioned at portions of the substrate 110 between adjacent back electrodes 152. In this instance, a mask is selectively or partially positioned on the back surface of the substrate 110 and impurity ions of the first conductivity type are injected into the back surface of the substrate 110 to selectively or partially form an impurity portion of the first conductivity type on the back surface of the substrate 110. Then, a portion of the impurity portion is formed as the back surface field region by heating the impurity and a portion of the back surface field region is removed from a surface of the back surface field region by a predetermined thickness, to form the back surface field part.

Unlike the solar cell shown in FIG. 11, at least one of the emitter part 121a and the back surface field part 172a may have the selective emitter structure or the selective back surface field structure.

Figure 12:
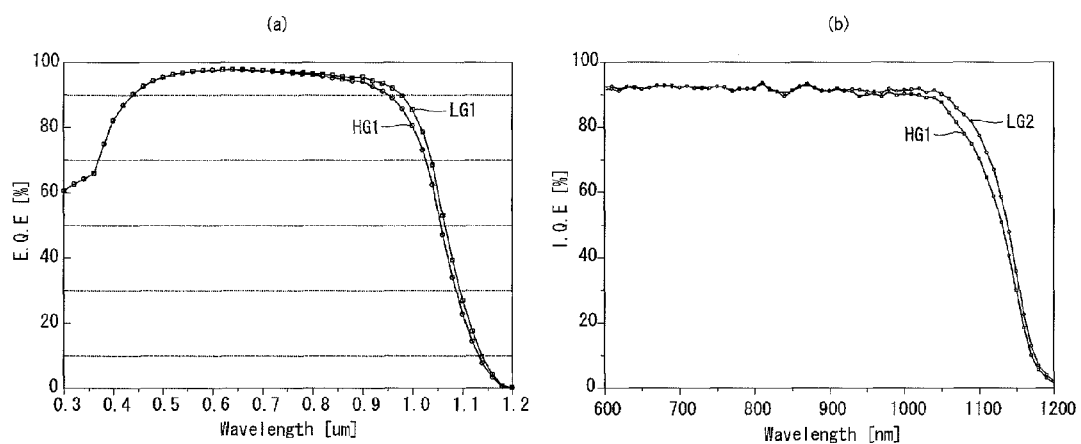
FIG. 12 shows graphs illustrating an external quantum efficiency and an internal quantum efficiency of the solar cell shown in FIG. 11 depending on a wavelength variation of light.

When the back surface field part has the selective back surface field structure formed by the ion implantation process, the activation process and the etching process, the solar cell may obtain a quantum efficiency depending on a wavelength of light, as shown in (A) and (B) of FIG. 12.

(A) of FIG. 12 shows a simulated graph of an external quantum efficiency (E.Q.E) depending on a variation of the wavelength of light, and in the graph, the first back surface field portion which is a low impurity doped portion has an impurity doped concentration of about $3 \times 10^{19}$ cm$^{-3}$ and the second back surface field portion which is a high impurity doped portion has an impurity doped concentration of about $2 \times 10^{20}$ cm$^{-3}$.

As shown in (A) of FIG. 12, the maximum wavelength of light absorbed into the substrate 110 not passing through the substrate 110 is about 1200 nm, and at the back surface of the substrate 110 absorbed light of a wavelength of 900 nm and more, an external quantum efficiency LG1 measured at the first back surface field portion, at which a damage portion is removed is larger than an external quantum efficiency HG1 measured at the second back surface field portion at the back surface of the substrate 110, at which a damage portion exists.

(B) of FIG. 12 shows a graph of an internal quantum efficiency (I.Q.E) depending on a variation of a wavelength of light obtained based on the external quantum efficiency shown in (A) of FIG. 12. As shown in (B) of FIG. 12, an internal quantum efficiency LG2 measured at the first back surface field portion, at which a damage portion is removed is larger than an internal quantum efficiency HG2 measured at the second back surface field portion at the back surface of the substrate 110, at which a damage portion exists.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell, the method comprising:
    injecting first impurity ions at a first surface of a substrate by using a first ion implantation method to form a first impurity region, the substrate having a first conductivity type and the first impurity ions having a second conductivity type opposite the first conductivity type, and the first impurity region having the second conductivity type;
    first heating the substrate with the first impurity region to activate the first impurity region to form an emitter region from the first impurity region;
    etching the emitter region from a surface of the emitter region to a predetermined depth to form an emitter part from the emitter region;
    forming a first electrode on the emitter part to connect to the emitter part by using a screen printing method, and then being dried;
    injecting second impurity ions at a second surface of the substrate by using a second ion implantation method to form a second impurity region of the first conductivity type, the second surface being opposite the first surface of the substrate;
    second heating the substrate with the second impurity region to activate the second impurity region to form a surface field region from the second impurity region;
    etching the surface field region from a surface of the surface field region to a predetermined depth to form a surface field part from the surface field region; and
    forming a second electrode on the surface field part to connect to the surface field part by using a screen printing method, and then being dried,
    wherein the emitter part comprises a first emitter portion having a first impurity doped thickness and a second emitter portion having a second impurity doped thickness greater than the first impurity doped thickness,
    wherein the surface field part comprises a first surface field portion having a first impurity doped thickness and a second surface field portion having a second impurity doped thickness greater than the first impurity doped thickness,
    wherein the first electrode is connected to the first surface of the substrate through the second emitter portion, and
    wherein the second electrode is connected to the second surface of the substrate through the second surface field portion.

2. The method of claim 1, wherein the first heating of the substrate heats the first impurity region at 800° C. to 1100° C. in a nitrogen atmosphere.

3. The method of claim 1, wherein the etching of the emitter region removes a portion of the emitter region from the surface of the emitter region to a depth of 5 nm to 20 nm, and
    wherein the emitter region is etched by an etchant composed of nitric acid $HNO_3$, hydrofluoric acid HF and pure water.

4. The method of claim 1, wherein the first heating of the substrate heats the first impurity region at 800° C. to 1100° C. in an oxygen atmosphere.

5. The method of claim 1, wherein the etching of the emitter region removes a portion of the emitter region from the surface of the emitter region to a depth of 20 nm to 35 nm, and
    wherein the emitter region is etched by an etchant composed of hydrofluoric acid HF and pure water.

6. The method of claim 1, wherein the second heating of the substrate heats the second impurity region at 900° C. to 1100° C. in a nitrogen atmosphere.

7. The method of claim 1, wherein the etching of the surface field region removes a portion of the surface field region from the surface of the surface field region to a depth of 5 nm to 20 nm.

8. The method of claim 7, wherein the surface field region is etched by an etchant composed of nitric acid $HNO_3$, hydrofluoric acid HF and pure water.

9. The method of claim 1, wherein the second heating of the substrate heats the second impurity region at 900° C. to 1100° C. in an oxygen atmosphere.

10. The method of claim 1, wherein the etching of the surface field region removes a portion of the surface field region from the surface of the surface field region to a depth of 20 nm to 35 nm.

11. The method of claim 10, wherein the surface field region is etched by an etchant composed of hydrofluoric acid HF and pure water.

12. The method of claim 1, wherein the etching of the emitter region comprises:
    selectively forming an etch prevention layer on the emitter region to expose a portion of the emitter region and to cover a remaining portion of the emitter region;
    etching the exposed portion of the emitter region from the surface of the emitter region to the predetermined depth using the etch prevention layer as a mask; and
    removing the etch prevention layer,
    wherein the etched exposed portion of the emitter region is formed as the first emitter portion and the remaining portion of the emitter region is formed as the second emitter portion.

13. The method of claim 1, wherein the first impurity region comprises a first impurity portion having a first impurity doped thickness and a second impurity portion having a second impurity doped thickness greater than the first impurity doped thickness, and
    wherein the injecting of the first impurity ions forms the first and second impurity portions by use of a mask positioned at the first surface of the substrate and use of the first ion implantation method.

14. The method of claim 13, wherein the mask comprises a first portion having a first exposing area for forming the first impurity portion and a second portion having a second exposing area for forming the second impurity portion, the first and second exposing areas being areas exposing the substrate in a unit area thereof.

15. The method of claim 13, further comprising forming the first impurity region not having the first and second impurity portions at an entire first surface of the substrate by injecting the first impurity ions of the second conductivity type at the entire first surface of the substrate without a mask, before forming the first and second impurity portions of the first impurity region,
    wherein the forming of the first and second impurity portions of the first impurity region forms the first and second impurity portions by use of the mask positioned at the first impurity region not having the first and second impurity portions and use of the first ion implantation method.

16. The method of claim 1, wherein the etching of the surface field region comprises:

selectively forming an etch prevention layer on the surface field region to expose a portion of the surface field region and to cover a remaining portion of the surface field region;

etching the exposed portion of the surface field region from the surface of the surface field region to the predetermined depth using the etch prevention layer as a mask; and removing the etch prevention layer, wherein the etched exposed portion of the surface field region is formed as the first surface field portion and the remaining portion is formed as the second surface field portion.

17. The method of claim 1, wherein the second impurity region comprises a first impurity portion having a first impurity doped thickness and a second impurity portion having a second impurity doped thickness greater than the first impurity doped thickness, and wherein the injecting of the second impurity ions forms the first and second impurity portions by use of a mask positioned at the second surface of the substrate and use of the second ion implantation method.

18. The method of claim 17, wherein the mask comprises a first portion having a first exposing area for forming the first impurity portion and a second portion having a second exposing area for forming the second impurity portion, the first and second exposing areas being areas exposing the substrate in a unit area thereof.

19. The method of claim 17, further comprising forming the second impurity region not having the first and second impurity portions at an entire second surface of the substrate by injecting the second impurity ions at the entire second surface of the substrate without a mask, before forming the first and second impurity portions of the second impurity region, wherein the forming of the first and second impurity portions of the second impurity region forms the first and second impurity portions by use of the mask positioned at the second impurity part not having the first and second impurity portions and use of the second ion implantation method.

20. A method for manufacturing a solar cell, the method comprising:

injecting first impurity ions at a first surface of a substrate by using a first ion implantation method to form a first impurity region, the substrate having a first conductivity type and the first impurity ions having a second conductivity type opposite the first conductivity type, and the first impurity region having the second conductivity type;

heating the substrate with the first impurity region to activate the first impurity region to form an emitter region from the first impurity region;

forming a first electrode on the emitter region to connect to the emitter region by using a screen printing method, and then being dried;

injecting second impurity ions at a second surface of the substrate by using a second ion implantation method to form a second impurity region of the first conductivity type, the second surface being opposite the first surface of the substrate;

heating the substrate with the second impurity region to activate the second impurity region to form a surface field region from the second impurity region;

etching the surface field region from a surface of the surface field region to a predetermined depth to form a surface field part from the surface field region; and forming a second electrode on the surface field part to connect to the surface field part by using a screen printing method, and then being dried, wherein the surface field part comprises a first surface field portion having a first impurity doped thickness and a second surface field portion having a second impurity doped thickness greater than the first impurity doped thickness, and wherein the second electrode is connected to the second surface of the substrate through the second surface field portion.

* * * * *